(12) United States Patent
Akiyama

(10) Patent No.: US 8,363,136 B2
(45) Date of Patent: *Jan. 29, 2013

(54) SOLID-STATE IMAGING DEVICE, METHOD OF FABRICATING SOLID-STATE IMAGING DEVICE, AND CAMERA

(75) Inventor: Kentaro Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/178,640

(22) Filed: Jul. 8, 2011

(65) Prior Publication Data

US 2011/0261223 A1    Oct. 27, 2011

Related U.S. Application Data

(63) Continuation of application No. 12/354,457, filed on Jan. 15, 2009.

(30) Foreign Application Priority Data

Jan. 21, 2008 (JP) ................................ 2008-010904

(51) Int. Cl.
*H04N 5/335* (2006.01)
*H01L 31/02* (2006.01)
*H01L 21/30* (2006.01)

(52) U.S. Cl. .............................. 348/294; 257/72; 438/72

(58) Field of Classification Search ........................ None
See application file for complete search history.

(56) References Cited

U.S. PATENT DOCUMENTS

| 6,872,584 | B2 * | 3/2005 | Nakashiba ...................... 438/22 |
| 7,101,726 | B2 * | 9/2006 | Yamamoto et al. ............. 438/69 |
| 7,420,236 | B2 * | 9/2008 | Hashimoto .................... 257/294 |
| 2006/0091398 | A1 * | 5/2006 | Yamaguchi et al. ............ 257/72 |
| 2007/0215971 | A1 | 9/2007 | Yamamoto et al. |

FOREIGN PATENT DOCUMENTS

| JP | 2005-209677 | 8/2005 |
| JP | 2005-347707 | 12/2005 |
| JP | 2005-353631 | 12/2005 |
| JP | 2005-353955 | 12/2005 |
| JP | 2006-129298 | 5/2006 |
| JP | 2009-176777 | 8/2009 |

OTHER PUBLICATIONS

Japanese Office Action issued on Aug. 21, 2012, in connection with counterpart JP Application No. 2010-138667.

* cited by examiner

*Primary Examiner* — Luong T Nguyen
(74) *Attorney, Agent, or Firm* — SNR Denton US LLP

(57) ABSTRACT

A solid-state imaging device receiving incident light from a backside thereof. The imaging device includes a semiconductor layer on which a plurality of pixels including photoelectric converters and pixel transistors are formed, a wiring layer formed on a first surface of the semiconductor layer, a pad portion formed on a second surface of the semiconductor layer, an opening formed to reach a conductive layer of the wiring layer, and an insulating film extendedly coated from the second surface to an internal side-wall of the opening so as to insulate the semiconductor layer.

8 Claims, 17 Drawing Sheets

1

SOLID-STATE IMAGING DEVICE, METHOD OF FABRICATING SOLID-STATE IMAGING DEVICE, AND CAMERA

RELATED APPLICATION DATA

This application is a continuation of U.S. patent application Ser. No. 12/354,457, filed Jan. 15, 2009, the entirety of which is incorporated herein by reference to the extent permitted by law. The present application claims priority to Japanese Patent Application No. JP 2008-010904 filed in the Japanese Patent Office on Jan. 21, 2008, the entirety of which also is incorporated by reference herein to the extent permitted by law.

BACKGROUND OF THE INVENTION

1. Field of the Invention

The invention relates to a backside-illuminated solid-state imaging device, a method of fabricating the backside-illuminated solid-state imaging device, and a camera.

2. Description of the Related Art

In a CMOS type solid-state imaging device, there has been disclosed a backside-illuminated solid-state imaging device for improving photoelectric conversion efficiency and sensitivity to incident light. In the backside-illuminated solid-state imaging device, light is illuminated from backside of the solid-state imaging device. The backside-illuminated solid-state imaging device is configured to include a semiconductor substrate on which photodiodes as photoelectric converters, pixel transistors, a plurality of wiring layers forming a signal circuitry, and the like are formed (see Japanese Unexamined Patent Application Publication No. 2005-347707, and Japanese Unexamined Patent Application Publication No. 2005-353631).

The backside-illuminated solid-state imaging device includes a pad portion formed on a rear side of the semiconductor substrate that can supply predetermined electrical potential to a multilayer interconnect formed on a front-surface side of the semiconductor substrate.

FIG. 1 is a schematic cross-sectional configuration diagram illustrating a backside-illuminated solid-state imaging device according to the related art. The cross-sectional configuration diagram in FIG. 1 specifically illustrates a region that includes a pad portion 60 formed in a peripheral region of a rear side of the backside-illuminated solid-state imaging device.

The backside-illuminated solid-state imaging device 70 includes an imaging region in which photodiodes 54 each used as a photoelectric converter and a plurality of pixels including pixel transistors (MOS transistors), a peripheral circuitry are formed on a semiconductor Si layer 53, and a pad portion 60 formed in a peripheral region of a rear side thereof. Although not shown in the figure, the pixel transistors each forming a pixel are formed on a front-surface side of the Si layer 53. Further, multi-layer interconnects 52 (e.g., Cu interconnects) and a plurality of wiring layers 51 including a wire-bonding AL interconnect 52a are formed on a surface of the Si layer 53 via an interlayer dielectric 61. A supporting substrate 50 formed of a silicon substrate is formed on a front-surface side of the plurality of wiring layers 51.

In contrast, an insulating film 55 used as an antireflective film, a shield film 56, and a passivation film 57 are multiply layered in this order on a rear side of the Si layer 53. Further, on-chip color filters are formed on the passivation film 57 corresponding to the imaging region, and on-chip microlenses 53 are formed on the passivation film 57. The imaging region includes an optical black region formed outside of an effective pixel region for specifying black levels of images. Pixels and color filters similar to the pixels in the effective pixel region are formed in the optical black region. The shield film 56 is formed over an entire surface including other pixel transistors and peripheral circuitries except for light-receiving portions in the effective pixel region, namely, the photodiodes 54 and pad portions 60.

The pad portion 60 includes an opening 62 to expose the AL interconnect 52a connected to predetermined interconnects 52 of the plurality of wiring layers 51. Specifically, after the on-microchiplenses have been formed, an opening 62 is formed such that desired Al interconnects 52a are exposed from a rear surface of the backside-illuminated solid-state imaging device 70 towards a front-surface thereof on which the multilayer interconnection layer 51 is formed, thereby forming the pad portion 60 for taking out an electrode. In this process, the pad portion 60 is formed by etching the Si layer 53 including photodiodes 54 formed thereon, an insulating film 55 formed on an incident light surface of the Si layer 53, an interlayer dielectric 61 of the plurality of wiring layers 51, and the like. In the pad portion 60 formed in this manner, for example, Au fine wires (so called bonding wires) 63 are connected to Al interconnects 52a (wire-bonding) that are exposed from the opening 62.

However, in the related art backside-illuminated solid-state imaging devices, since the Si layer 53 is exposed from an internal sidewall of the pad portion 60, the Si layer 53 and the Au fine wires 63 are brought into contact when the Au fine wires 63 are wire-bonded to the Al interconnects 52a in the pad portion 60. Therefore, current is likely to flow between a well region (e.g., p-type well region) for the Au fine wires 63 having ground potential and a region having different potential. That is, leak current flows from the Au fine wires 63 to the Si layer 53.

The interlayer dielectric 61 of the plurality of wiring layers 51 is exposed from the internal sidewall of the opening 62 forming the pad portion 60. The interlayer dielectric 61 includes metal used as the interconnects 52 forming a signal circuitry. Thus, only providing the interlayer dielectric 61 that is exposed from the opening 62 may not be sufficient to prevent the interconnects 52 from absorbing moisture. That is, the interconnects 52 may deteriorate under a high-humidity environment. In the cutting-edge CMOS process, an insulating film with a small dielectric constant (a Low-κ dielectric) is used as the interlayer dielectric 61 of the plurality of wiring layers 51; however, a film property of the Low-κ dielectric may also deteriorate under such high-humidity environment, thereby exhibiting no moisture resistance in the interlayer dielectric 61.

Japanese Unexamined Patent Application Publication No. 2005-347707 discloses a pad portion configuration including an insulating film formed on the sidewall thereof. However, in this configuration, since the insulating film is only formed for the pad portion, the number of steps for fabricating backside-illuminated solid-state imaging devices may increase. Moreover, the pad portion may be coated with an organic film, however, the organic film may not be able to cover the pad portion sufficiently (not enough coverage), thereby exhibiting not enough reliability.

Further, since the related art shield film used in the backside-illuminated solid-state imaging device is electrically floating, electrical potential is not stabilized. As a result, the electrical potential of the shield film may cause an adverse effect on pixels of the solid-state imaging device.

SUMMARY OF THE INVENTION

Embodiments of the invention intend to provide a solid-state imaging device that exhibits excellent reliability, a method of fabricating the solid-state imaging device, and a camera.

An embodiment of the invention intends to provide a solid-state imaging device receiving incident light from a backside thereof. The imaging device includes a semiconductor layer on which a plurality of pixels including photoelectric converters and pixel transistors are formed, a plurality of wiring layers formed on a first surface of the semiconductor layer, a pad portion formed on a second surface of the semiconductor layer, an opening formed to reach a conductive layer of the plurality of wiring layers, and an insulating film extendedly coated from the second surface to an internal side-wall of the opening so as to insulate the semiconductor layer.

An embodiment of the invention also provides a method of fabricating a solid-state imaging device. The method includes forming a plurality of wiring layers on a first surface of a semiconductor layer on which a plurality of pixels including photoelectric converters and pixel transistors, forming an opening corresponding to a pad portion of a second surface of the semiconductor layer to reach a conductive layer of the plurality of wiring layers, and forming an insulating film extendedly coated from the second surface to an internal side-wall of the opening so as to insulate the semiconductor layer.

An embodiment of the invention further provides a camera including a solid-state imaging device, an optical lens, and a signal processor. In the camera, the solid-state imaging device includes a semiconductor layer on which a plurality of pixels including photoelectric converters and pixel transistors are formed, a plurality of wiring layers formed on a first surface of the semiconductor layer, a pad portion formed on a second surface of the semiconductor layer, an opening formed to reach a conductive layer of the plurality of wiring layers, and an insulating film extendedly formed from the second surface to an internal side-wall of the opening so as to coat the semiconductor layer.

In an embodiment of the invention, the insulating film is extendedly formed from the surface of the semiconductor layer to the internal side-wall of the opening of the pad portion formed on the solid state imaging device to insulate the semiconductor layer, advert effect on the semiconductor layer and the plurality of wiring layers may be prevented.

According to an embodiment of the invention, since the insulating film is extendedly coated from the surface of the semiconductor layer to the internal side-wall of the opening of the pad portion, the advert effect on the semiconductor layer and the plurality of wiring layers may be prevented, thereby improving product reliability of the solid-state imaging device.

DESCRIPTION OF THE PREFERRED EMBODIMENTS

Embodiments of the invention will be described below with reference to accompanying drawings.

Figure 2:
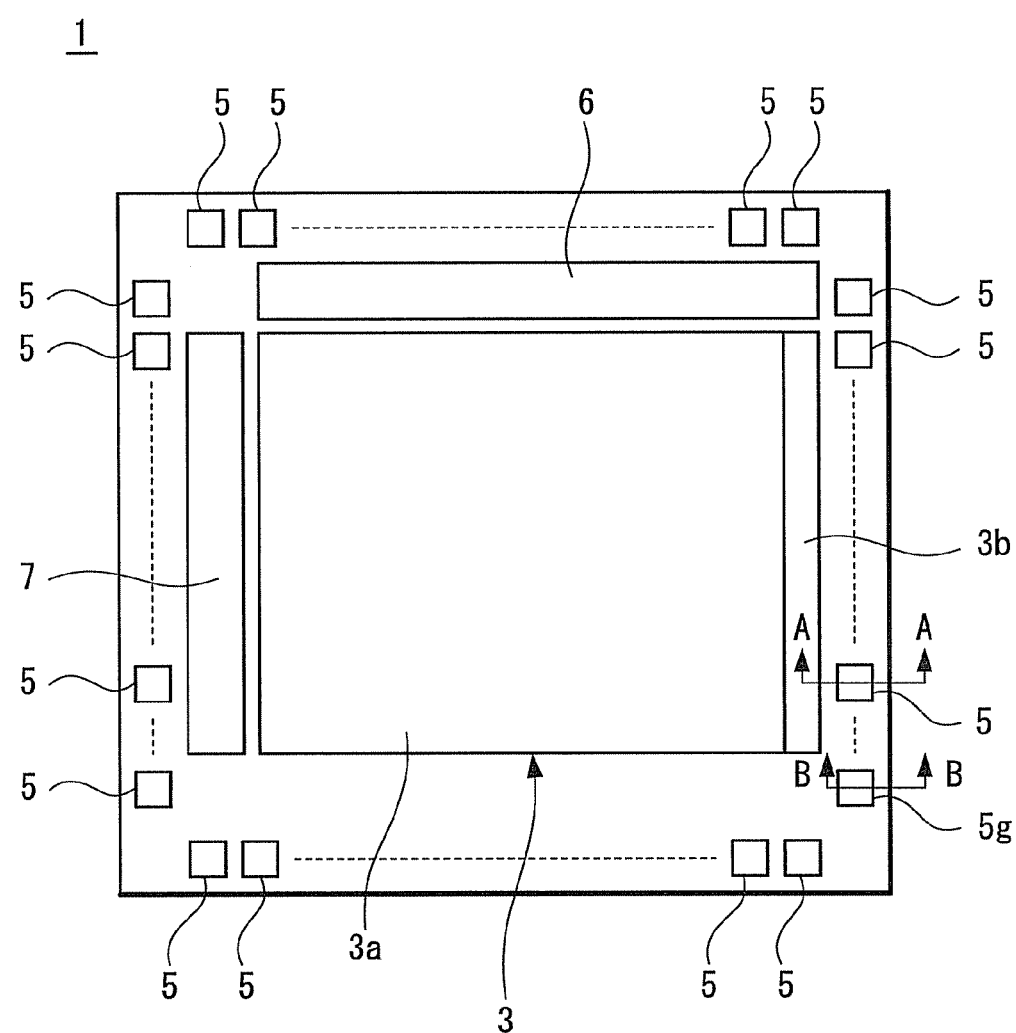
FIG. 2 is a schematic diagram illustrating a solid-state imaging device according to a first embodiment of the invention.

FIG. 2 is a schematic diagram illustrating a solid-state imaging device according to a first embodiment of the invention. A solid-state imaging device according to embodiments of the invention is a backside-illuminated CMOS solid-state imaging device.

A solid-state imaging device according to an embodiment of the invention is configured to include imaging region 3, peripheral circuitries 6, 7, pad portions 5.

The imaging region 3 includes a matrix of numerous unit pixels, and address lines arranged in rows, and signal lines arranged in columns. The imaging region 3 includes an effective pixel region 3a and an optical black region 3b that determines a black level of each pixel.

The optical black region 3b also includes similar pixels as those included in the effective pixel region 3a. The pixels in the optical black region 3b are arranged outside of the effective pixel region 3a. An entire region of the solid-state imaging device, excluding the photoelectric converters (light-receiving portion) of the effective pixel region 3a and the pad portions 5, is covered with the shield film.

Each pixel in the imaging region 3 includes the photoelectric converter such as a photodiode and a plurality of pixel transistors (MOS transistors). Each of the pixel transistors may include four transistors, examples of which include a transferring transistor, a resetting transistor, an amplifying transistor, and a selecting transistor. Alternatively, each pixel transistor may simply include three transistors, examples of which include the transferring transistor, the resetting transistor, and the amplifying transistor. Or, each pixel transistor may include other transistors.

Figure 3:
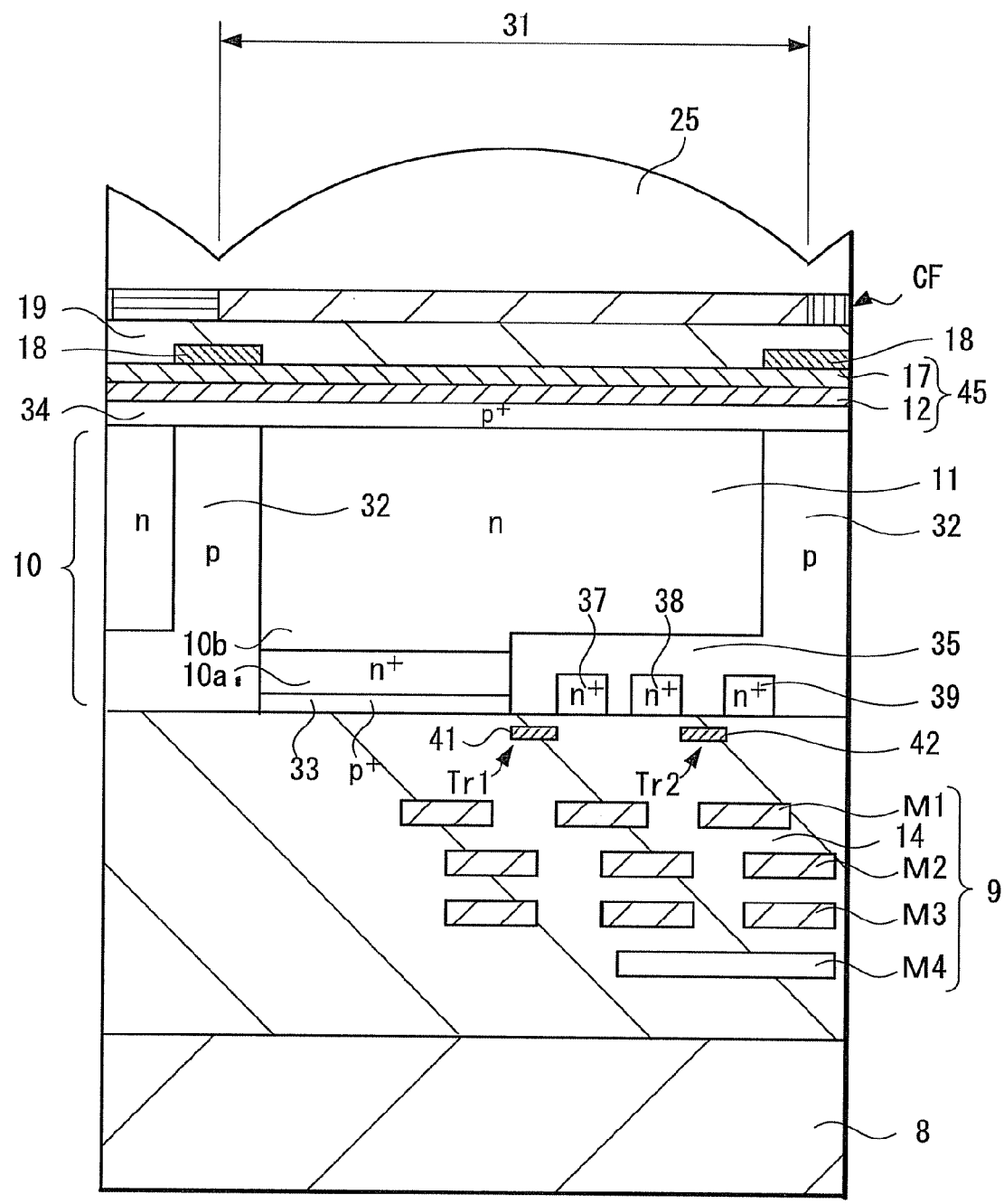
FIG. 3 is a schematic cross-sectional configuration diagram illustrating main parts of the solid-state imaging device according to the embodiment of the invention.

FIG. 3 shows an example of a cross sectional structure of the unit pixel. In this example, a unit pixel 31a is formed by forming a second conductive p-type pixel separating region 32, a photodiode (PD) 11 as a photoelectric converter and a plurality of pixel transistors Tr1, Tr2 on a first conductive n-type silicon semiconductor layer 10. The photodiode 11 includes an n-type semiconductor layer 10 surrounded by a p-type pixel separating region 32 and a relatively deeply formed p-type semiconductor well region 35 in which the pixel transistors Tr1 and Tr2 are formed, and p+ accumulation layers 33, 34 for controlling dark current on both front-surface and rear-surface sides of the solid-state imaging device. The n-type semiconductor layer 10 forming the photodiode 11 includes a highly concentrated n+ charge-storing region 10a and a lowly concentrated n-type region 10b forming the n-type semiconductor layer 10. The n-type region 10b of the n-type semiconductor 10 is extendedly formed below the p-type semiconductor well region 35 in which the pixel transistors Tr1, Tr2 are formed.

The pixel transistors Tr1, Tr2, for example, each include four transistors as described earlier. In the figure, Tr1 indicates a transferring transistor, and Tr2 indicates other transistors such as a resetting transistor, an amplifying transistor, or a selecting transistor. The pixel transistor Tr1 includes the n+ source-drain region 37 of floating diffusion, the n+ charge-storing region 10a of the photodiode 11, and a gate electrode 41 formed via a gate insulating film. The pixel transistor Tr2 includes a paired source drain regions 38, 39 and a gate electrode 42.

A plurality of wiring layers 9 having interconnects M1 to M4 multiply layered via an interlayer dielectric 14 is formed on a front-surface of the semiconductor layer 10, and a supporting substrate 8 formed such as a silicon substrate is bonded to the plurality of wiring layers 9. The interconnects M1 to M3 in the first to third layers forms a signal circuitry which is formed of Cu interconnects by damascene process. The interconnect M4 in the fourth layer is a conductive layer including Al interconnects that is connected with Au fine wires wire-bonding process.

An insulating film used as antireflective film 45 is provided with a rear side of the semiconductor layer 10. The antireflective film 45 is formed of a film stack having a nitride film (SiN) 12 and a silicon oxide ($SiO_2$) film 17 stacked on the semiconductor layer 10 in this order. The shield film 18 is formed on the antireflective film 45 excluding a light-receiving portion for a photodiode, and a passivation film 19 is further formed over the shield film 18. The passivation film 19 may be formed of a planarized film. The shield film 18 is formed of a metal film. Further, an on-chip color filters CF for primary colors of red (R), green (G), blue (B) are formed on the passivation film 19 corresponding to the imaging region, and on-chip microlenses 25 are formed on the on-chip color filters CF.

In contrast, although not shown in the figure, peripheral circuitries 6, 7 each are configured to include a vertical driving circuitry, a column signal processing circuitry, a horizontal driving circuitry, an output circuitry, a control circuitry, and the like. The control circuitry generates a clock signal or control signal that controls fundamental operation of the vertical driving circuitry, column signal processing circuitry, and horizontal driving circuitry based on a vertical synchronizing signal, a horizontal synchronizing signal, and a master clock; and input the generated signals into the vertical driving circuitry, column signal processing circuitry, horizontal driving circuitry, and the like. The vertical driving circuitry may be formed of a shift register that sequentially selects and scans pixels per column in the imaging region 3 in a vertical direction, and then supplies to the column signal processing circuitry signal charge generated based on an amount of light received by the photoelectric converter for each pixel via vertical signal lines. The column signal processing circuitries are arranged for each column of the pixels, and signals output by the pixels per row is signal-processed per pixel such as noise cancellation or signal amplification with signals output by the black reference pixels in the optical black region. A horizontal selecting switch is connected between horizontal signal lines in an output stage of the column signal processing circuitry. The horizontal driving circuitry may be formed of a shift register that sequentially selects pixels per column of the column signal circuitry by sequentially outputting horizontal pulses, and then causes each of the column signal processing circuitries to output the pixel signals to the horizontal signal lines. The output circuitry signal processes the signals sequentially supplied from each of the column signal processing circuitries via the horizontal signal lines, and outputs the resulting signals.

Since the solid-state imaging device 1 of the embodiment is backside-illuminated type, a plurality of pad portions 5 are formed around the imaging region thereof such that interconnects formed on the front-surface of the solid-state imaging device 1 can be taken out of the pad portions 5. One of the pad portions 5 is used as a ground interconnect (hereinafter called "ground connecting pad portion") 5g. In the ground connecting pad portion 5g, a ground interconnect is connected with the shield film 18 as will be described later. The ground connecting pad portion 5g includes an opening formed in the same step as the step of forming an opening in the pad portion 5.

Figure 4:
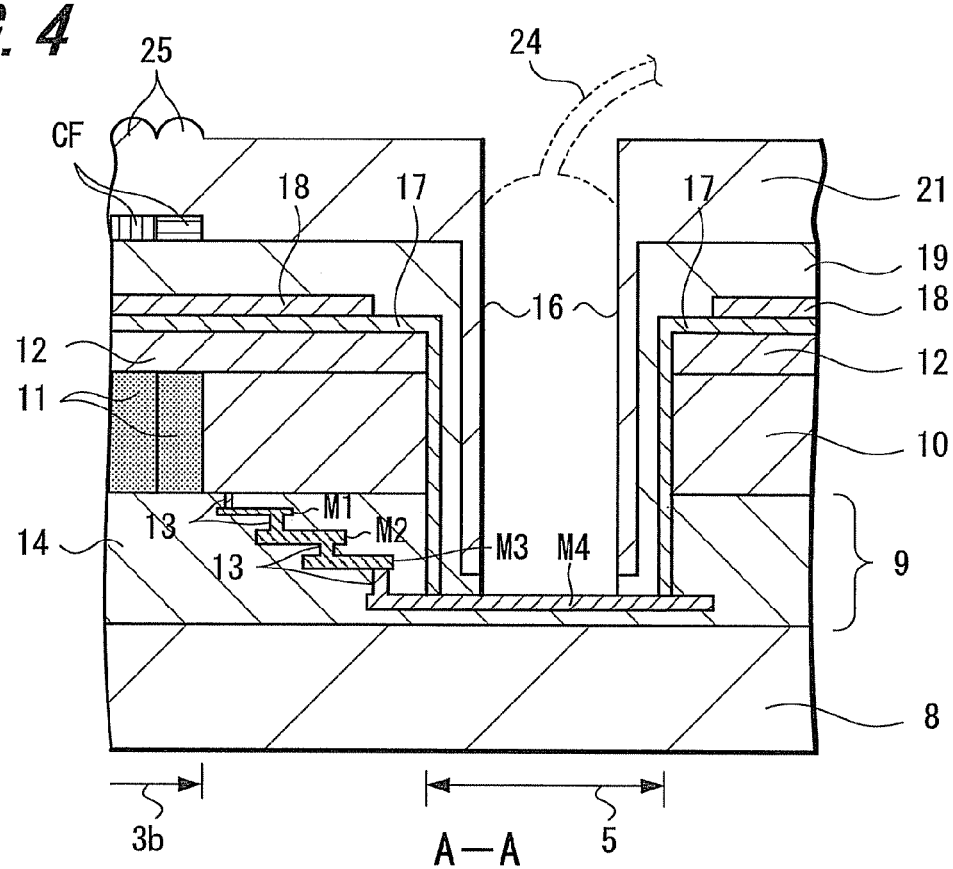
FIG. 4 is a schematic cross-section configuration diagram illustrating a pad portion used in the solid-state imaging device according to the embodiment of the invention.
Figure 5:
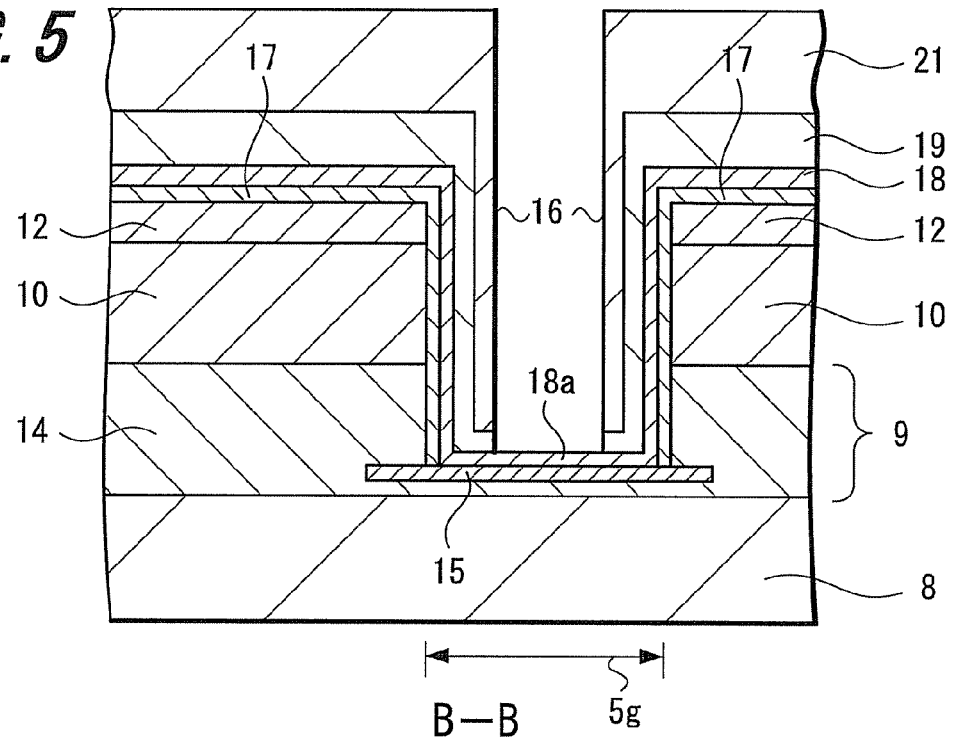
FIG. 5 is a schematic cross-sectional configuration diagram illustrating a ground connection pad portion used in the solid-state imaging device according to the embodiment of the invention.

FIG. 4 illustrates a cross sectional structure of the pad portion 5 along A-A line in FIG. 2. According to the solid-state imaging device 1 of the embodiment, insulation is securely formed so as to separate bonding wires, such as Au fine wires wire-bonded with the pad portions 5, from the semiconductor layer 10 in the pad portion 5 as shown in FIG. 4. FIG. 5 illustrates a cross sectional structure of the ground connecting pad portion 5g along B-B line in FIG. 2. As shown in FIG. 5, in the ground connecting pad portion 5g, ground potential is provided with the shield film 18, and insulation is securely formed to separate the shield film 18 with the ground potential from the semiconductor layer 10.

As shown in FIG. 4, adequate Cu interconnects of M1, M2, and M3 are connected in the plurality of wiring layers 9. In this embodiment, the interconnects M1 to M3 are connected, and interconnects M3 and M4 (conductive layer) are connected. The interconnect M4 is extended to a portion corresponding to the pad portion 5. The pad portion 5 includes an opening 16 such that the Al interconnect M4 is exposed from the surface of the on-chip microlens film 21, on which the on-chip microlenses 25 are formed. A silicon oxide film 17, passivation film 19, and on-chip microlens film 21 that form an antireflective film are provided 10 as an insulating film on an internal side-wall of the opening 16 so as to cover the semiconductor layer 10. The Al interconnect M4 is exposed from a bottom of the opening 16. The shield film 18 is not formed on a region corresponding to the opening 16.

Bonding wires such as Au fine wires 24 are wire-bonded with the Al interconnect M4 exposed from the bottom face of the pad portion 5. In the pad portion 5, an insulating film including the silicon oxide film 17, passivation film 19, and on-chip microlens film 21 are extendedly formed such that the semiconductor layer 10 on the internal side-wall of the opening 16 is insulated, thereby preventing contingent current leak. The interconnects M1 to M4 of the plurality of wiring layers 9 and the interlayer dielectric 14 can be prevented from absorbing moisture. Thus, the reliability of the solid-state imaging device can be improved.

As shown in FIG. 5, of the interconnects M1 to M4 (not shown in the figure) in the plurality of wiring layers 9, the ground interconnect (conductive layer) 15 connected to the predetermined interconnects to which ground potential is supplied is extended to a position corresponding to a position of the ground interconnecting pad portion 5g. The ground interconnect 15 is formed of Al fine wires, and formed simultaneously with the interconnect M4 in the same layer thereof. The ground interconnecting pad portion 5g includes the opening 16 formed from the surface of the on-chip microlens film 21 to the ground interconnect 16, the silicon oxide film 17 used as an antireflective film in the imaging region on the internal side-wall of the opening 16 so as to insulate the semiconductor layer 10, and an extended portion 18a of the shield film 18 formed from internal side-wall of the opening 16 to the bottom thereof so that the shield film is electrically connected to the ground interconnect 15. Further, the passivation film 19 and the microlens film 21 are also extendedly formed on the internal side-wall of the opening 16. Although not shown in the figure, the ground interconnect 15 is electrically connected to the pad portion 5 to which the ground potential is supplied. A configuration of the pad portion 5 to which the ground potential is supplied is substantially the same as that of the pad portion 5 in FIG. 4.

In the ground connecting pad portion 5g having such a configuration, since the extended portion 18a of the shield film 18 is electrically connected to the ground interconnect 15 extended to the opening 16, the shield film 18 is set to the ground potential and is electrically stabilized. Further, since the silicon oxide film 17 forming the antireflective film and extendedly formed on the internal side-wall of the opening provides insulation between the semiconductor layer 10 and shield film 18, the semiconductor layer 10 is securely insulated from the shield film 18. Since the passivation film 19 and on-chip microlens film 21 are extendedly formed on the internal side-wall of the opening 16, absorption of moisture in the interconnects M1 to M4 in the plurality of wiring layers 9 can be prevented. Thus, the reliability of the solid-state imaging device can be improved.

Next, a method of fabricating the aforementioned solid-state imaging device 1, in particular, a method of fabricating the pad portion having a cross sectional configuration along A-A and B-B in FIG. 2 is described with reference to FIGS. 6A, 6B to 17. The A-A cross sectional configuration indicates a cross sectional configuration of the pad portion 5 and the optical black region 3b whereas the B-B cross sectional configuration indicates a cross sectional configuration of the ground connecting pad portion 5g of the shield film.

Figure 6A:
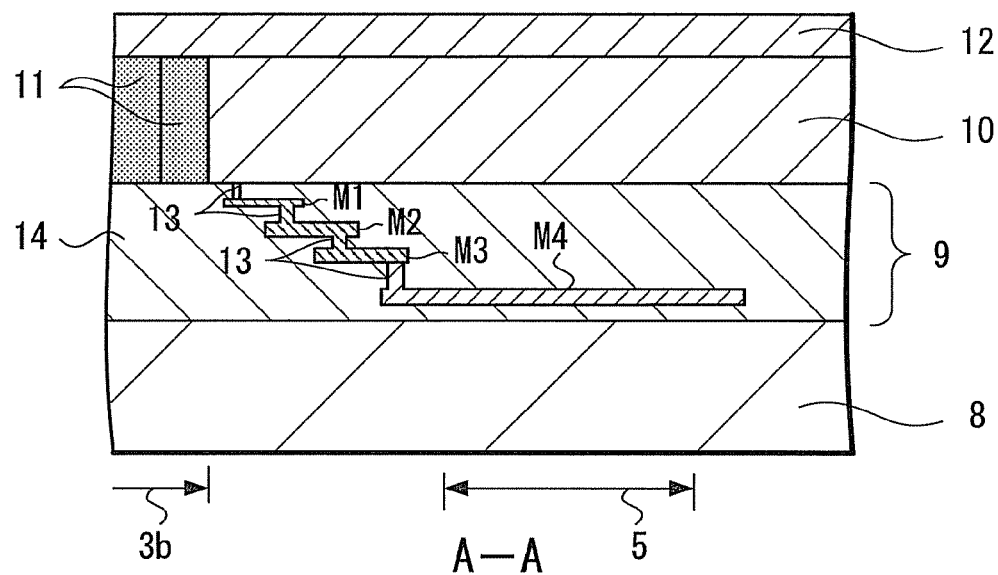
FIGS. 6A, 6B are respectively a cross-section configuration diagram along the line A-A, and a cross-sectional configuration diagram along the line B-B (part one) of the solid-state imaging device according to the embodiment of the invention.
Figure 6B:
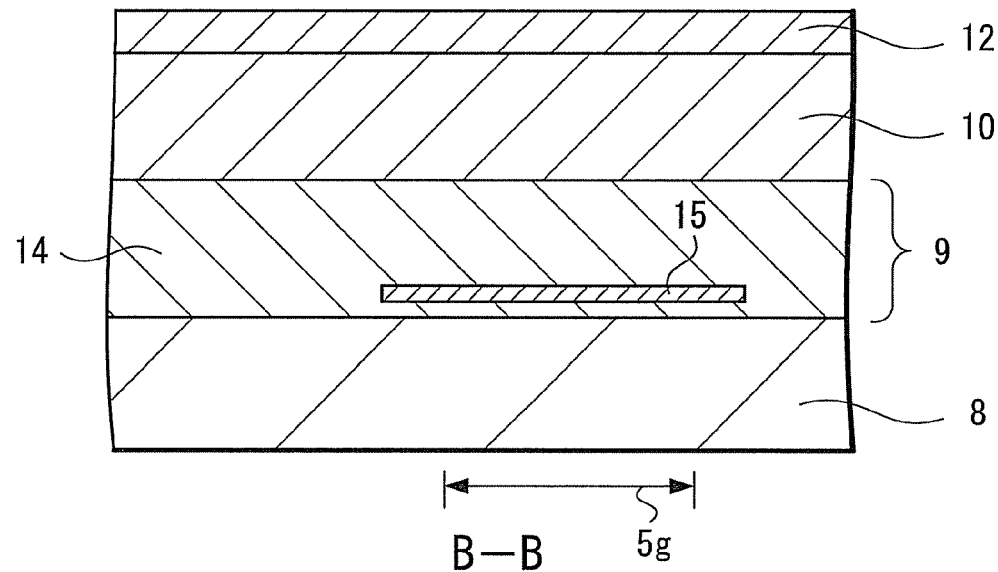

First, as shown in FIGS. 6A, 6B, there is provided a structure including the Si semiconductor layer 10, the plurality of wiring layers 9 formed on the front-surface of the Si semiconductor layer 10, and the supporting substrate 8 provided on the front-surface of the plurality of wiring layers 9. The imaging region of the Si semiconductor layer 10 includes two dimensionally arranged pixels formed of photodiodes 11 each used as a photoelectric converter and a plurality of pixel transistors. A method of fabricating the structure includes forming the semiconductor layer 10 and the plurality of wiring layers 9 on a separate substrate; bonding the supporting substrate 8 on a surface of the plurality of wiring layers 9; and removing the substrate on which the semiconductor layer 10 has been formed.

In the plurality of wiring layers 9, a plurality of interconnects including those for signal circuitries and other components are formed via the interlayer dielectric 14, for a material of which silicon oxide film ($SiO_2$) is used. FIG. 6A is one example of the plurality of wiring layers 9 including four interconnects M1, M2, M3, M4, each of which is connected to one of predetermined interconnects via a contact hall 13. In this embodiment, the interconnect M4 is wire-bonded to an external connection in the later-described pad portion 5. The interconnect M4 is made of Aluminum (Al) so as to have an excellent connection with Au bonding wire. The first to third interconnects M1 to M3 can be made either of Al or Cu. If the interconnects M1 to M3 are made of Cu, the interconnects M1 to M3 will exhibit excellent conductivity. The plurality of wiring layers 9 in FIG. 6B also includes predetermined interconnects; however, only the ground interconnect 15 is illustrated in FIG. 6B. The ground interconnect 15 is placed so as to brought into contact with the shield film in the later-described ground connecting pad portion 5g, thereby setting potential of the shield film to be congruent with the ground potential. Since the cross sectional configuration along the line B-B of the solid-state imaging device 1 in FIG. 2 excludes the effective pixel region 3a and the optical black region 3b, the photodiodes 11 are not formed on the Si semiconductor layer 10.

Referring back to FIG. 6B, a nitride film (SiN) 12 forming the antireflective film 45 is formed on the entire surface of the Si semiconductor layer 10. In this embodiment, the nitride film is used as the antireflective film 45; however, the antireflective film 45 may be configured to include the nitride film and a hafnium oxide ($HfO_2$) film stacked thereon.

In this embodiment, the front-surface of the solid-state imaging device is defined as a side forming the plurality of wiring layers 9 whereas the rear-surface thereof is defined as a side forming the antireflective film, in viewing from the Si semiconductor layer 10 on which the photodiodes 11 are formed.

Figure 7A:
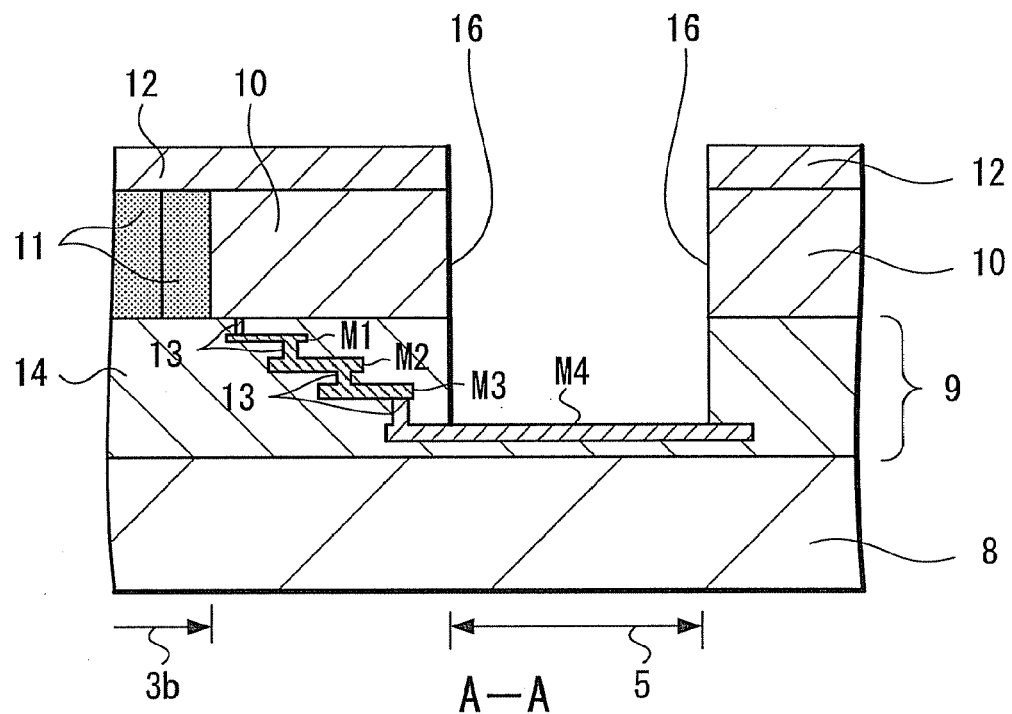
FIGS. 7A, 7B are respectively a cross-section configuration diagram along the line A-A, and a cross-sectional configuration diagram along the line B-B (part two) of the solid-state imaging device according to the embodiment of the invention.
Figure 7B:
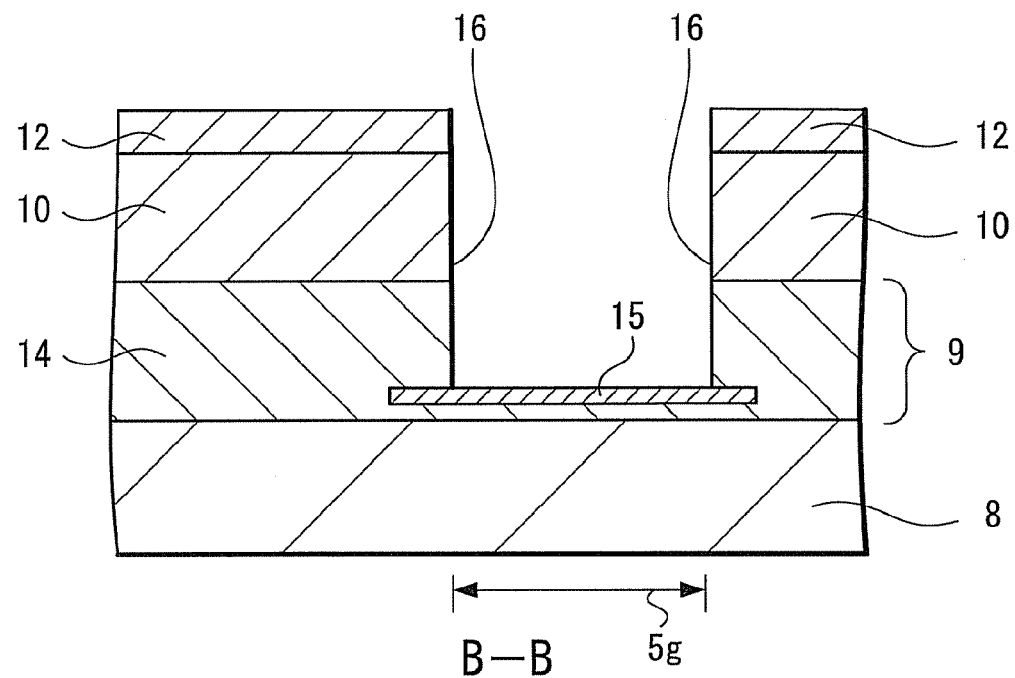

Next, as illustrated in FIGS. 7A, 7B, the openings 16 are formed by etching portions of the structure corresponding to the pad portion 5 and the ground connecting pad portion 5g. In FIG. 7A, the opening 16 is formed so as to expose the interconnect M4, whereas in FIG. 7B, the opening 16 is formed so as to expose the ground interconnect 15.

Figure 8A:
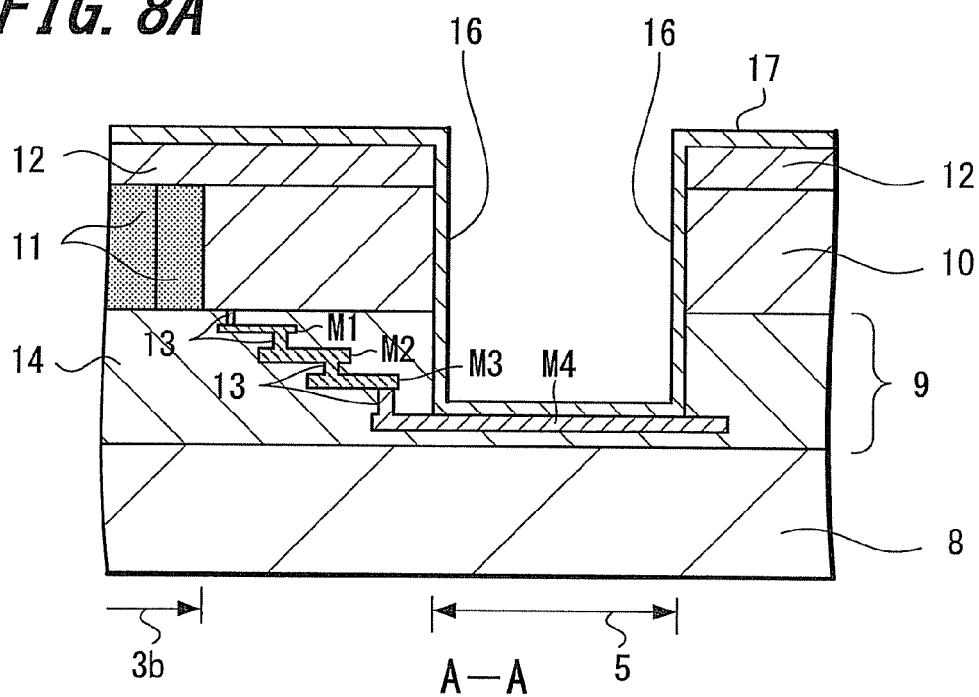
FIGS. 8A, 8B are respectively a cross-section configuration diagram along the line A-A, and a cross-sectional configuration diagram along the line B-B (part three) of the solid-state imaging device according to the embodiment of the invention.
Figure 8B:
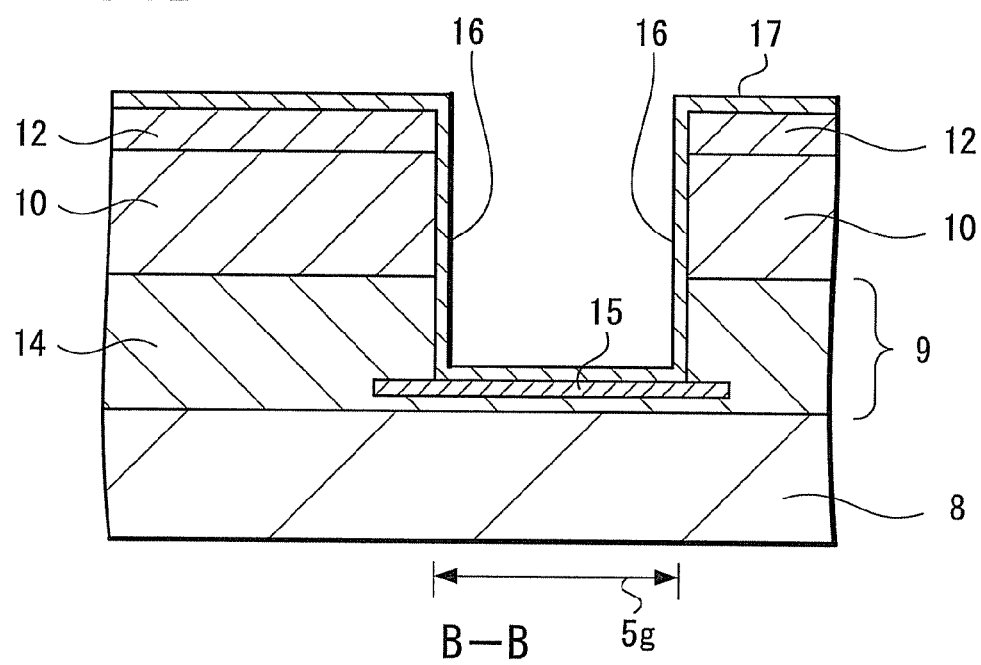

Next, as illustrated in FIGS. 8A, 8B, the silicon oxide (SiO$_2$) film 17 is deposited on the surface of the nitride film 12. The silicon oxide film is deposited on a sidewall and a bottom of the opening 16. In this embodiment, the antireflective film 45 is formed of a two-layered film including the nitride film 12 and the silicon oxide film.

Figure 9A:
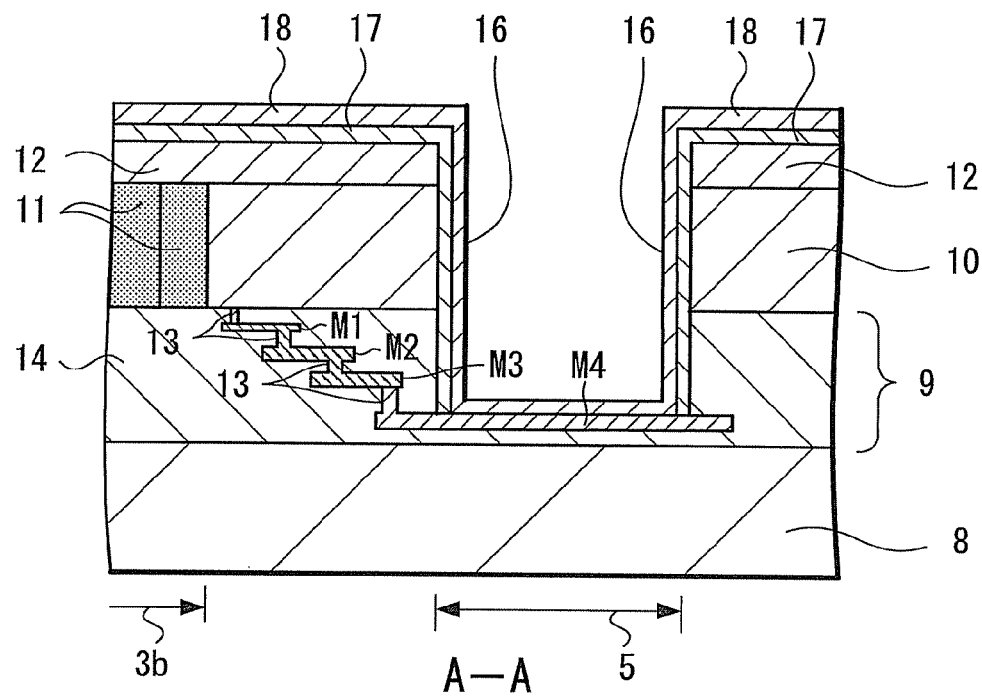
FIGS. 9A, 9B are respectively a cross-section configuration diagram along the line A-A, and a cross-sectional configuration diagram along the line B-B (part four) of the solid-state imaging device according to the embodiment of the invention.
Figure 9B:
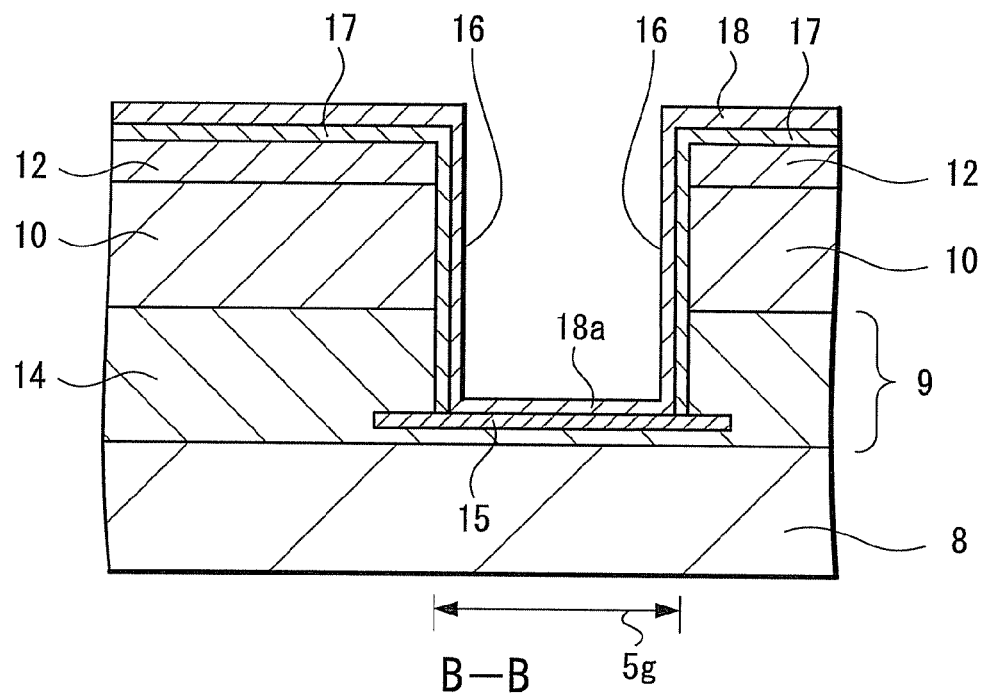

As illustrated in FIGS. 9A, 9B, the silicon oxide film 17 formed on the bottom of the opening 16 is selectively removed by etching. For example, after portions other than the bottom of the opening 16 have been masked with a resist film, the silicon oxide film 17 can be removed by dry-etching. The interconnect M4 and the ground interconnect 15 are re-exposed from the bottom of the opening 16 in this manner. After having selectively removed the silicon oxide film 17, the shield film is deposited on the entire internal side-wall of the opening 16. As examples of a material for the shield film 18 having shielding properties, tungsten (W), aluminum (Al), molybdenum (Mo), iridium (Ir) can be given. The shield film 18 is deposited on the entire internal side-wall of the opening by sputtering process or CVD process. A shield film deposited by sputtering process can exhibit more adhesiveness than a shield film made by CVD process. When the shield film is deposited by sputtering, the grain size of the material is relatively large; however, the grain size of the material is relatively small by CVD process, thereby improving the shielding properties of the material deposited by CVD process in comparison to that deposited by sputtering. Alternatively, the shield film may be deposited by sputtering and CVD processed in combination. In this embodiment, tungsten (W) is used as a material for the shield film 18.

Figure 10A:
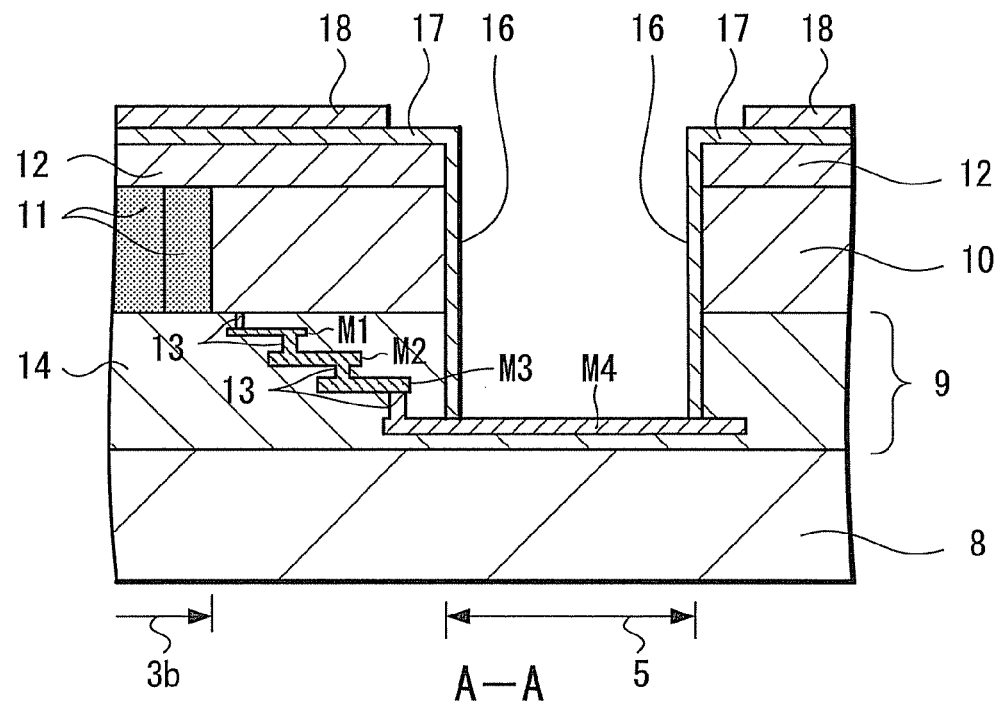
FIGS. 10A, 10B are respectively a cross-section configuration diagram along the line A-A, and a cross-sectional configuration diagram along the line B-B (part five) of the solid-state imaging device according to the embodiment of the invention.
Figure 10B:
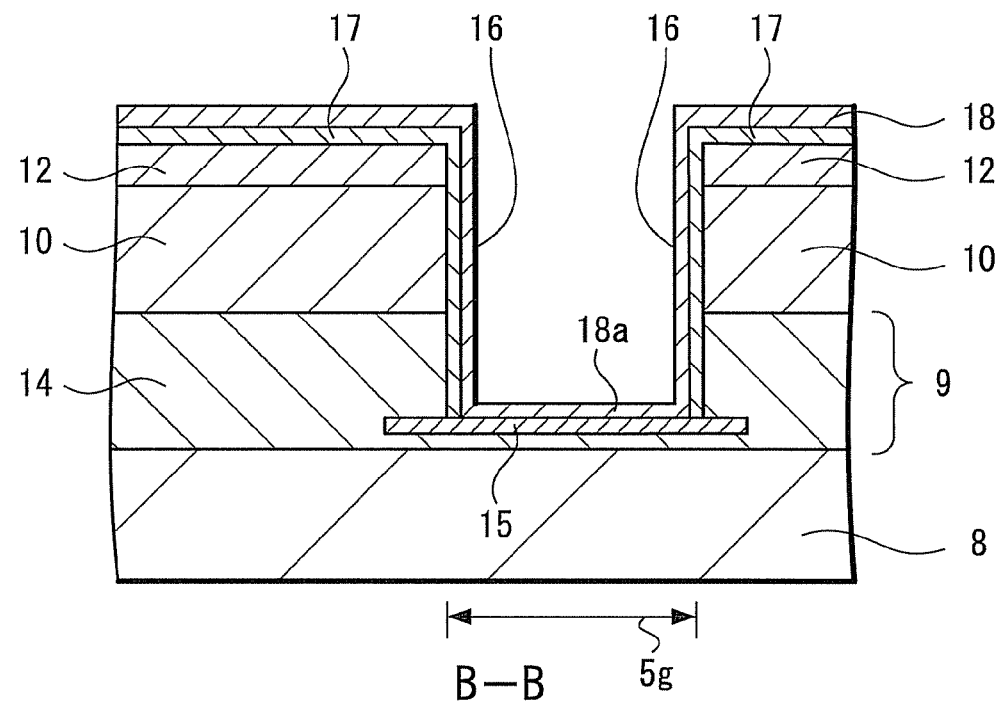

Subsequently, as illustrated in FIGS. 10A, 10B, the shield film 18 placed on the upper portions of the effective pixel region 3a and the pad portion 5 (see FIG. 2) is removed using a resist mask. The shield film 18 is selectively deposited on the internal side-wall of the opening 16 excluding the portions of photodiodes 11 (light-receiving portion) in the effective pixel region 3a and the pad portion 5 shown in FIG. 2.

For example, as illustrated in FIG. 10A, the shield film 18 is not deposited on the opening 16 of the pad portion 5 but is deposited on the optical black region 3b. As illustrated in FIG. 10B, the shield film 18 is deposited on the internal side-wall and the bottom of the opening 16 of the ground connecting pad portion 5g. The shield film 18 is connected to the ground interconnect 15 at the bottom of the opening 16 of the ground connecting pad portion 5g. Thus, the potential of the shield film 18 formed is fixed to the same potential as the ground potential. In this embodiment, the opening 16 is formed in the preceding step to the step of depositing the silicon oxide film 17. Since one of the openings 16 is formed as the ground connecting pad portion 5g that exposes the ground interconnect and the shield film 18 is deposited on the internal side-wall and the bottom of the opening 16 of the ground connecting pad portion 5g in the step of depositing the shield film 18, the potential of the shield film 18 is fixed to the same potential as the ground potential. Since the silicon oxide film 17 is deposited on the internal side-wall of the opening 16, the shield film 18 will not directly be in contact with the Si semiconductor 10 and the plurality of wiring layers 9.

Figure 11A:
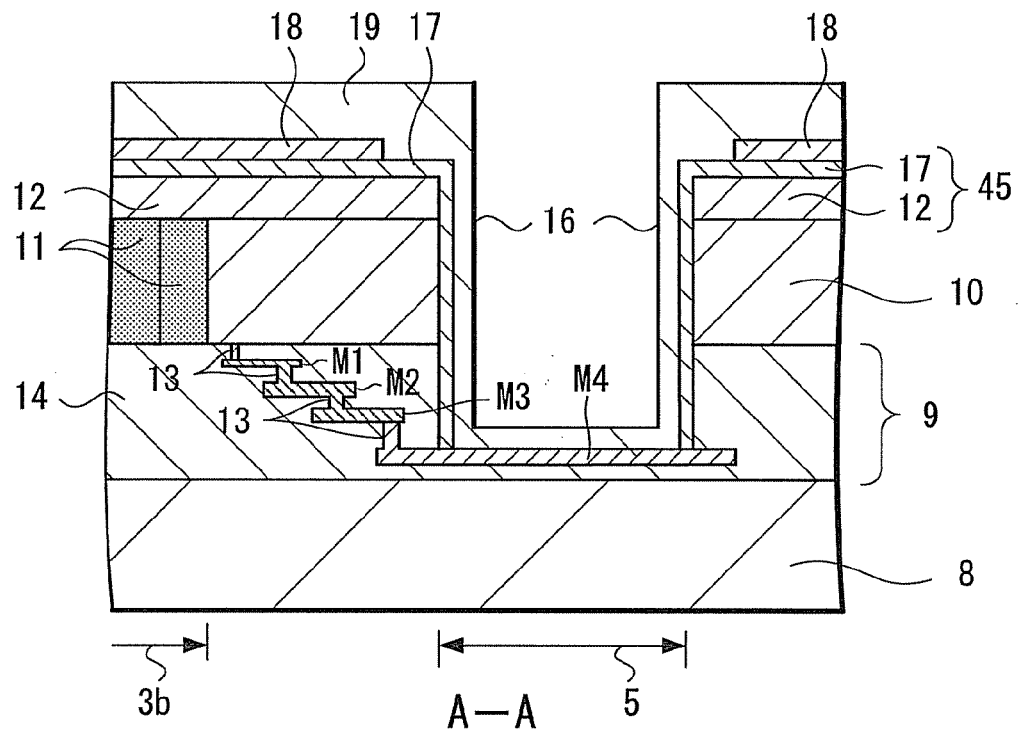
FIGS. 11A, 11B are respectively a cross-section configuration diagram along the line A-A, and a cross-sectional configuration diagram along the line B-B (part six) of the solid-state imaging device according to the embodiment of the invention.
Figure 11B:
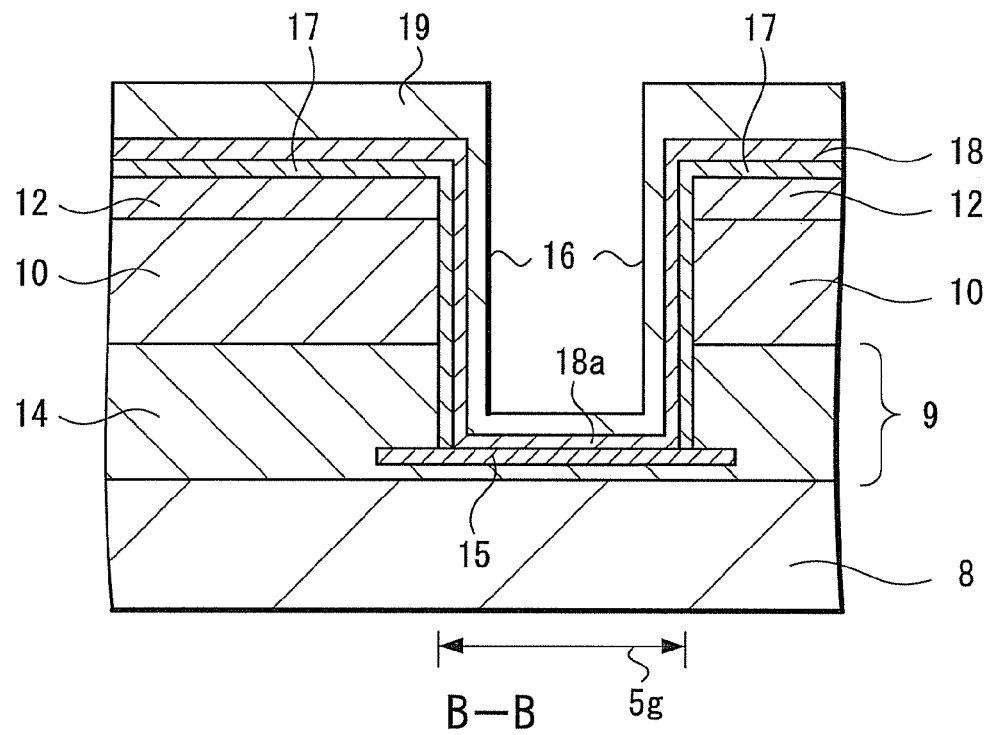

After the shield film 18 has been formed on the predetermined position, the passivation film 19 for planarization is deposited thereon as illustrated in FIGS. 11A, 11B. The passivation film is deposited on the entire surface including the internal side-wall and the bottom of the opening 16. As the passivation film 19, a silicon nitride (SiN) film can be used, and a plasma nitride film can more preferably be used.

Figure 12A:
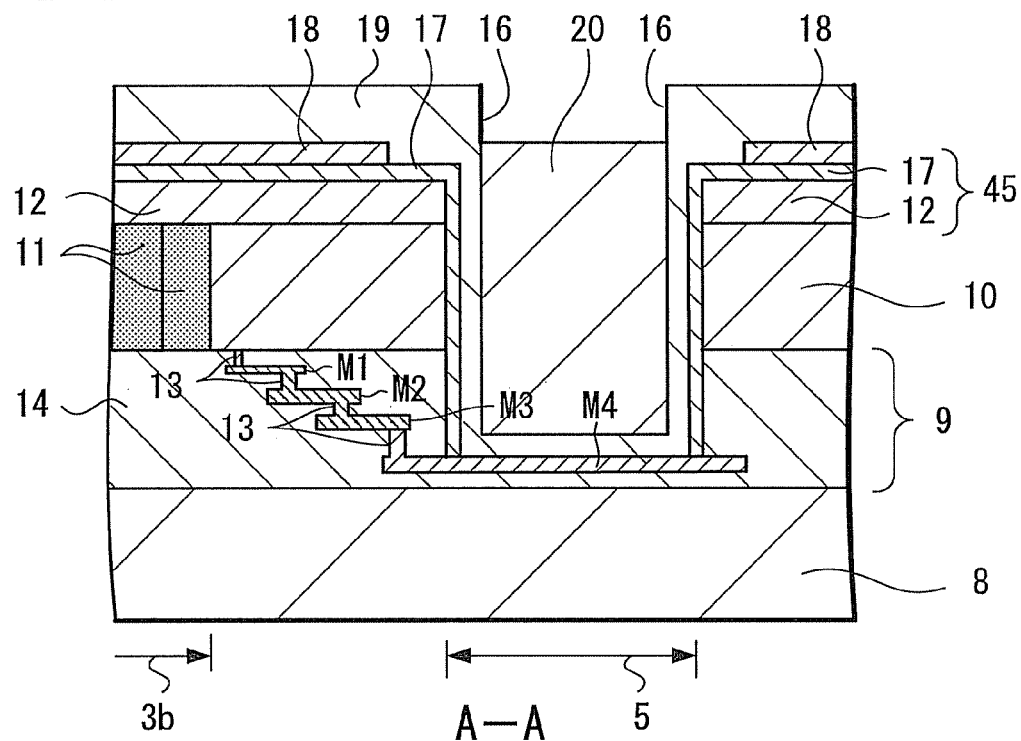
FIGS. 12A, 12B are respectively a cross-section configuration diagram along the line A-A, and a cross-sectional configuration diagram along the line B-B (part seven) of the solid-state imaging device according to the embodiment of the invention.
Figure 12B:
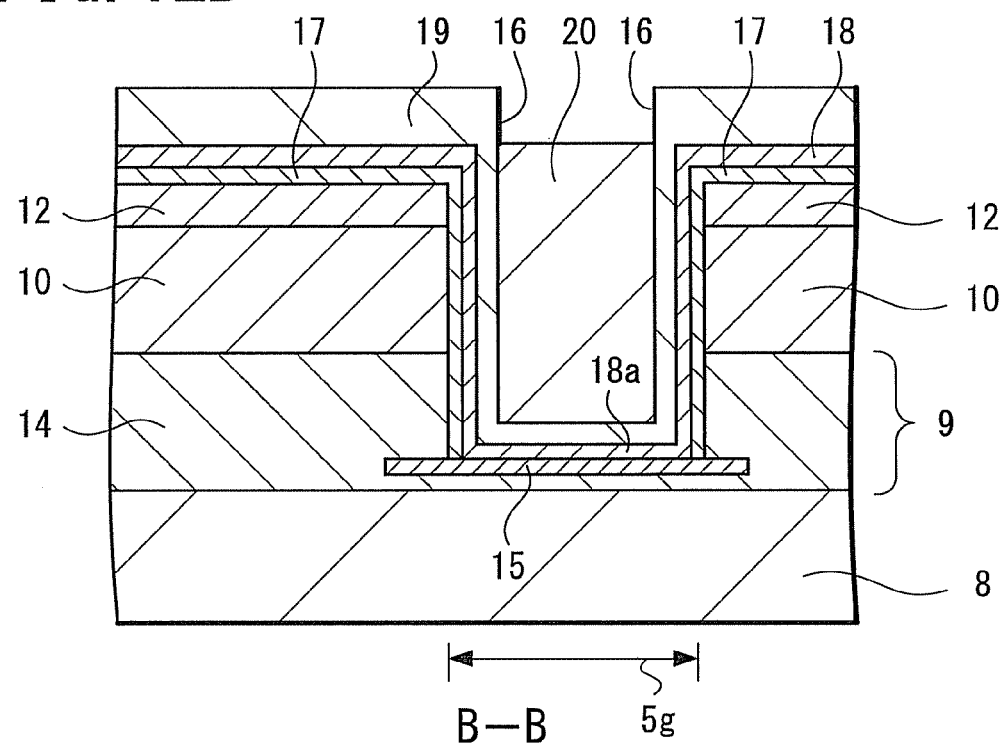

Next, as illustrated in FIGS. 12A, 12B, first resist layers 20 are placed in the openings 16 that form the pad portion 5 and the ground connecting pad portion 5g.

Figure 13A:
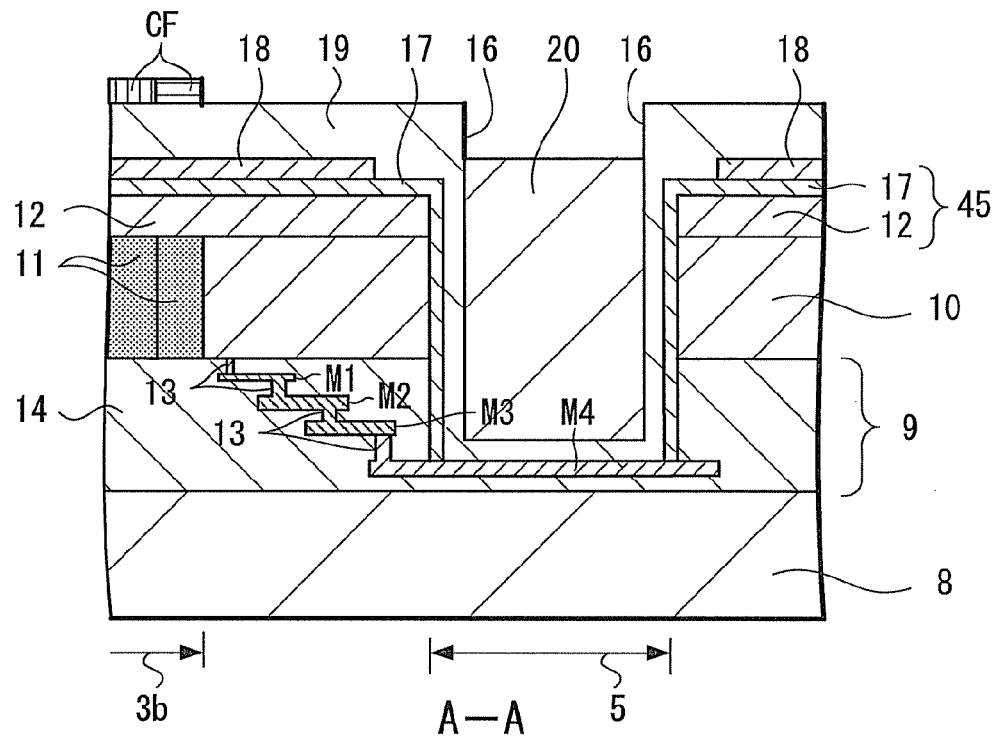
FIGS. 13A, 13B are respectively a cross-section configuration diagram along the line A-A, and a cross-sectional configuration diagram along the line B-B (part eight) of the solid-state imaging device according to the embodiment of the invention.
Figure 13B:
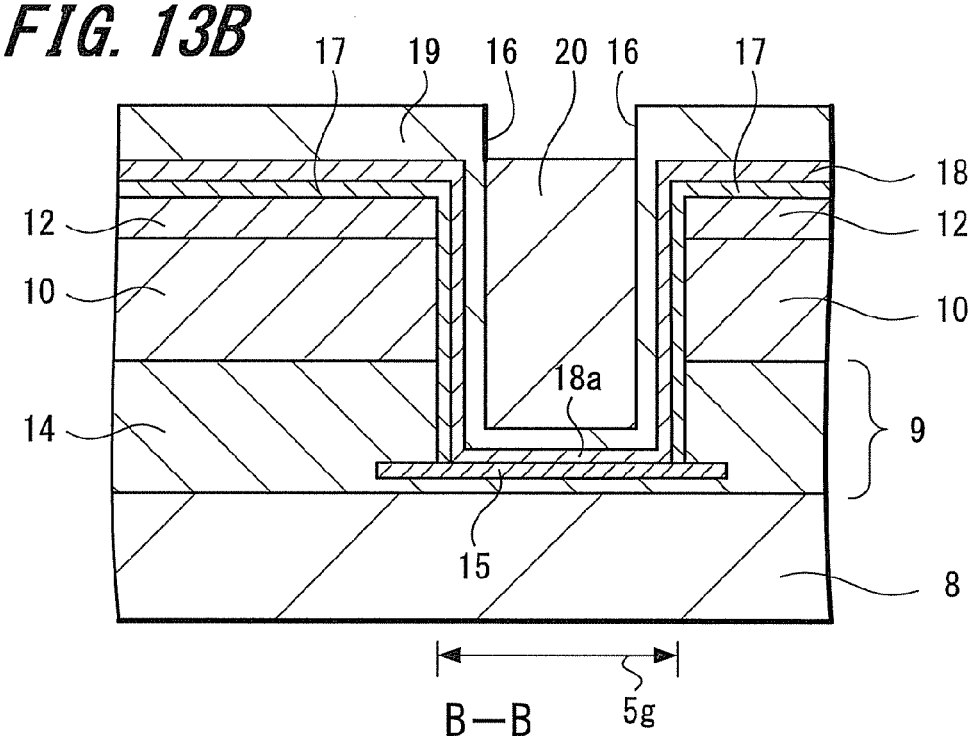

As illustrated in FIGS. 13A, 13B, on-chip color filters CF are formed corresponding to the photodiodes 11 in the effective pixel region 3a and the optical black region 3b (see FIG. 2.). In this embodiment, the on-chip color filters CF each corresponding to one of the colors R (red), G (green), B (blue) are formed so as to match with positions of the respective photodiodes 11. The on-chip color filters CF are formed by applying a resist for each color, exposing the resist, and developing the resist. Since the effective pixel region 3a and the optical black region 3b are not shown in the cross sectional configuration in FIG. 13B, the on-chip color filters CF are not illustrated in FIG. 13B.

Figure 14A:
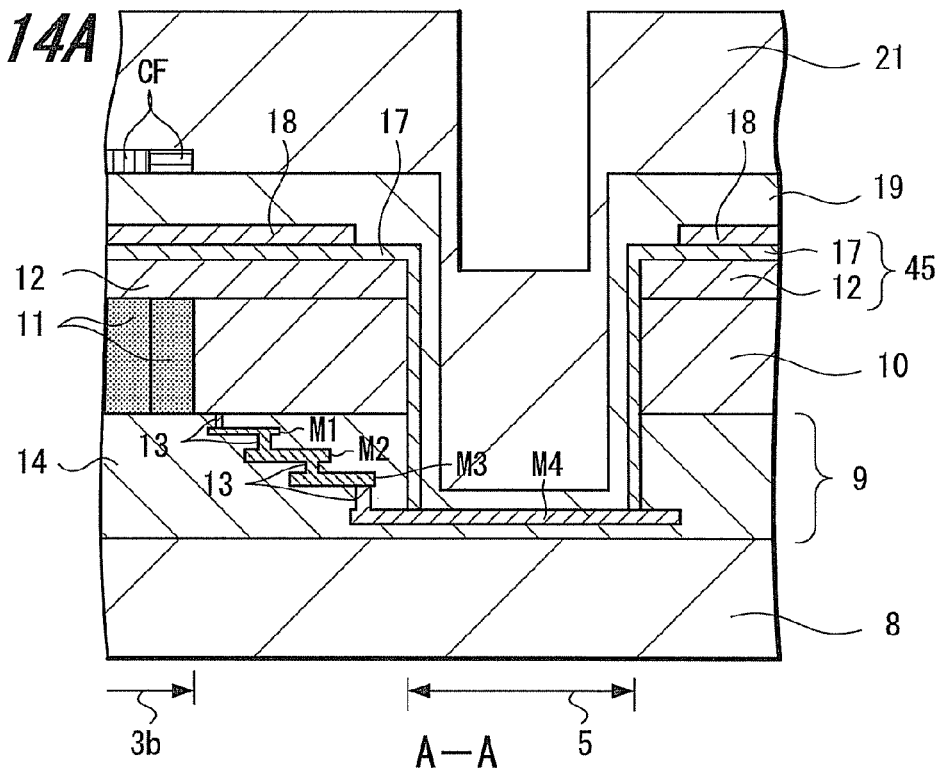
FIGS. 14A, 14B are respectively a cross-section configuration diagram along the line A-A, and a cross-sectional configuration diagram along the line B-B (part nine) of the solid-state imaging device according to the embodiment of the invention.
Figure 14B:
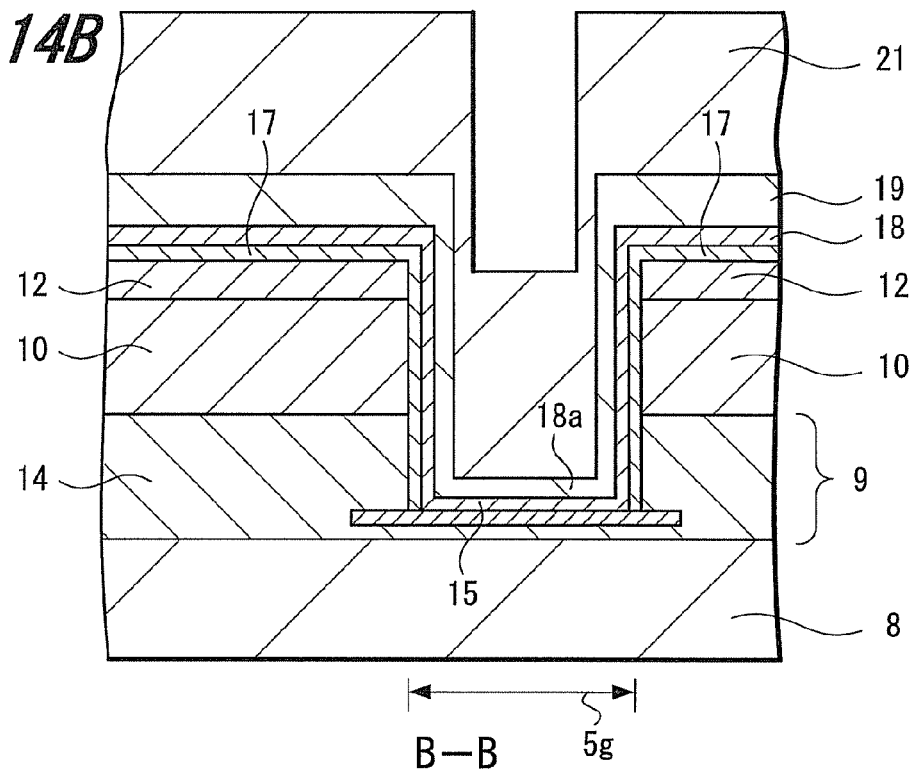

As shown in FIGS. 14A, 14B, the on-chip microlens film 21 is applied on the entire surface of the passivation film 19 including the surfaces of the on-chip color filters CF. The on-chip microlens film 21 is an organic material, an example of which includes novolac resin. The material is fabricated as an on-chip microlens in the subsequent step.

Figure 15A:
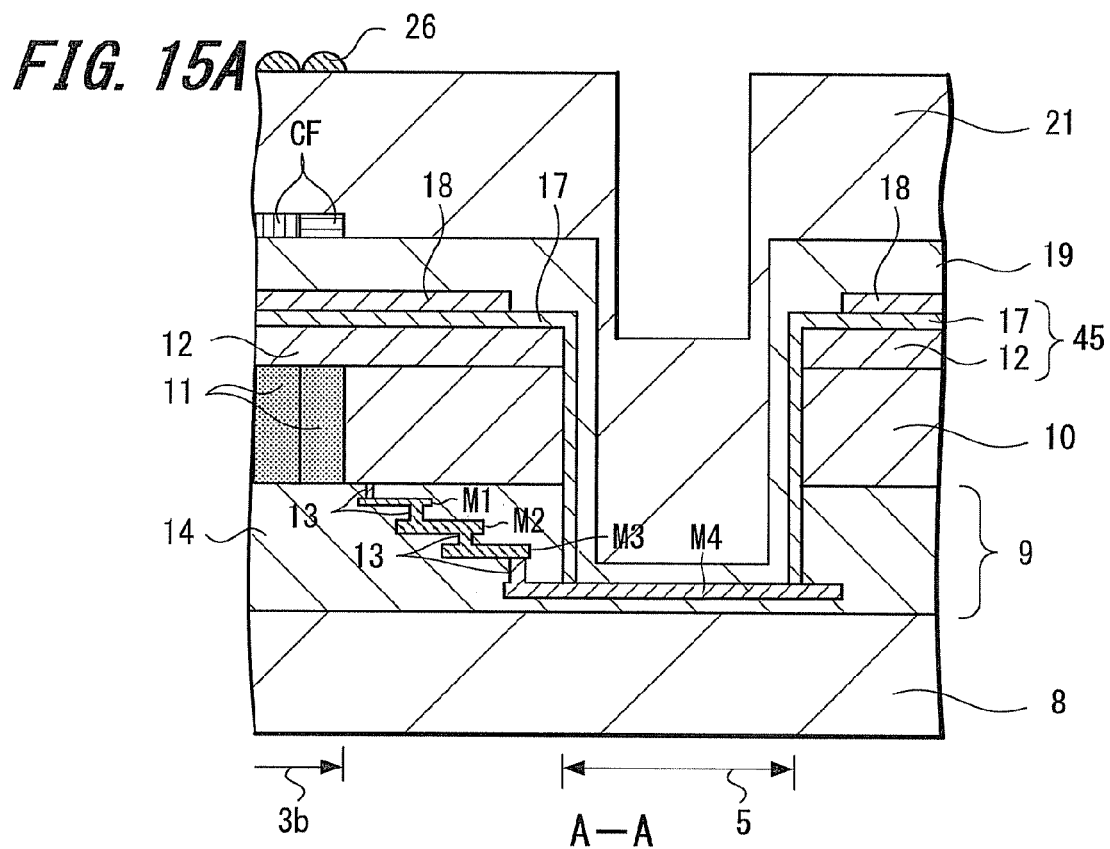
FIGS. 15A, 15B are respectively a cross-section configuration diagram along the line A-A, and a cross-sectional configuration diagram along the line B-B (part 10) of the solid-state imaging device according to the embodiment of the invention.
Figure 15B:
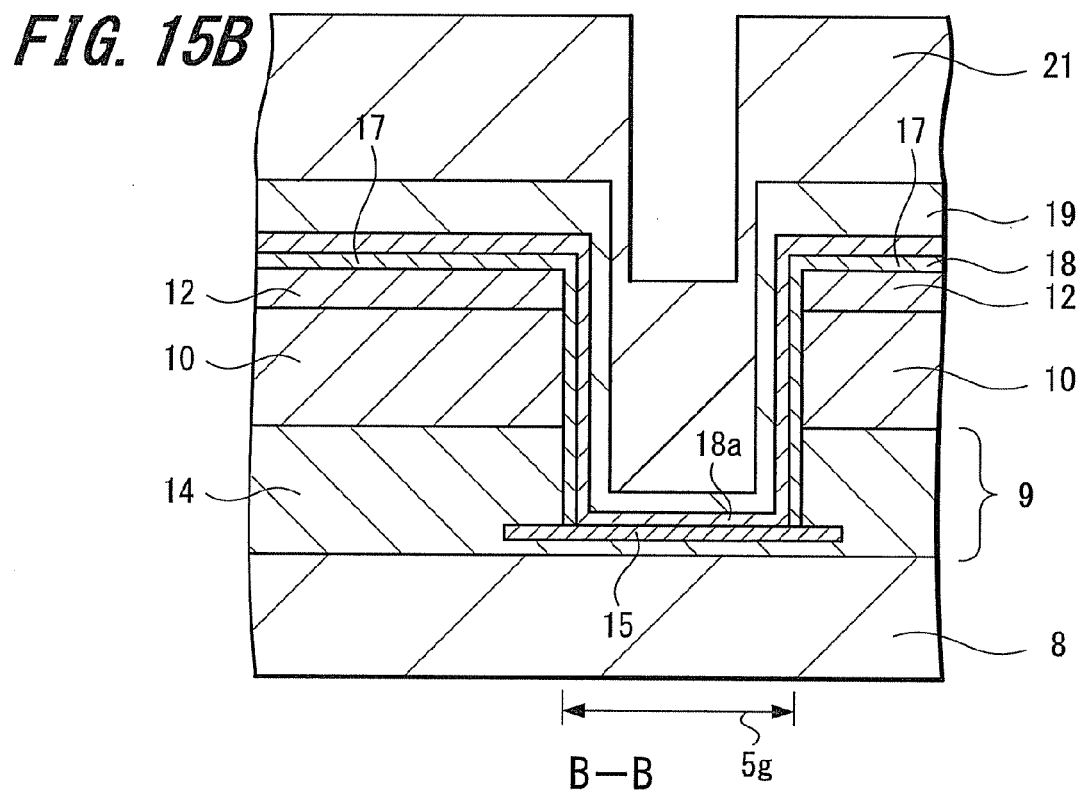

Next, as shown in FIG. 15A, having applied the on-chip microlens film 21, a second resist layer 26 is formed on positions corresponding to each of the on-chip color filters CF, and the second resist layer is then exposed, developed, reflowed to form a structure of the on-chip microlens.

Figure 16A:
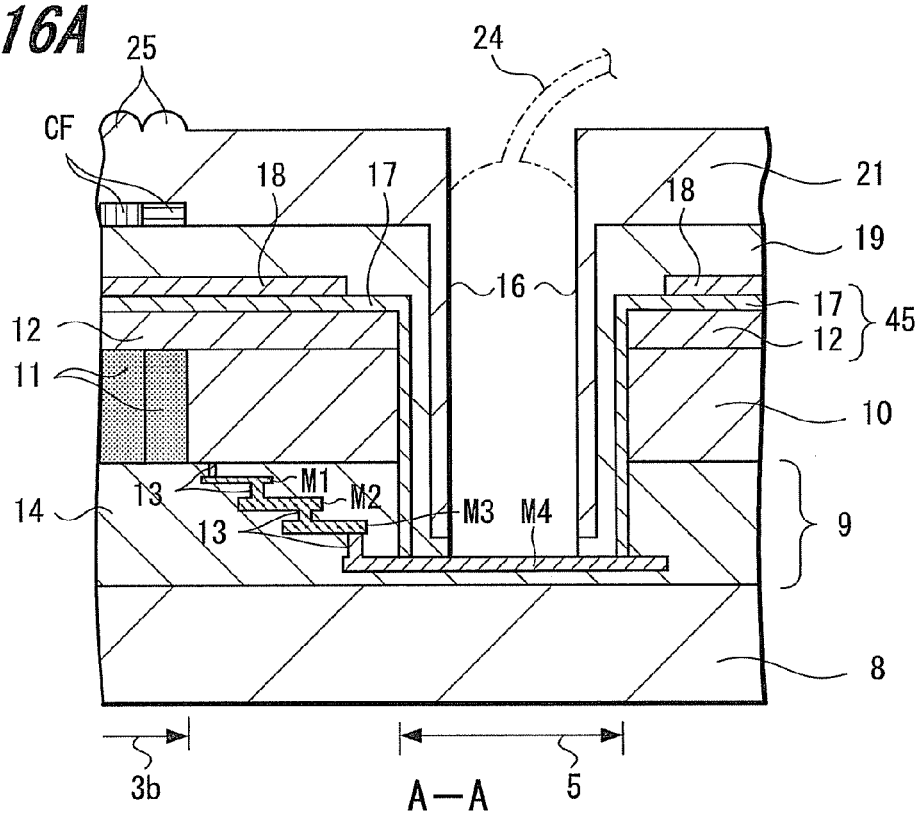
FIGS. 16A, 16B are respectively a cross-section configuration diagram along the line A-A, and a cross-sectional configuration diagram along the line B-B (part 11) of the solid-state imaging device according to the embodiment of the invention.
Figure 16B:
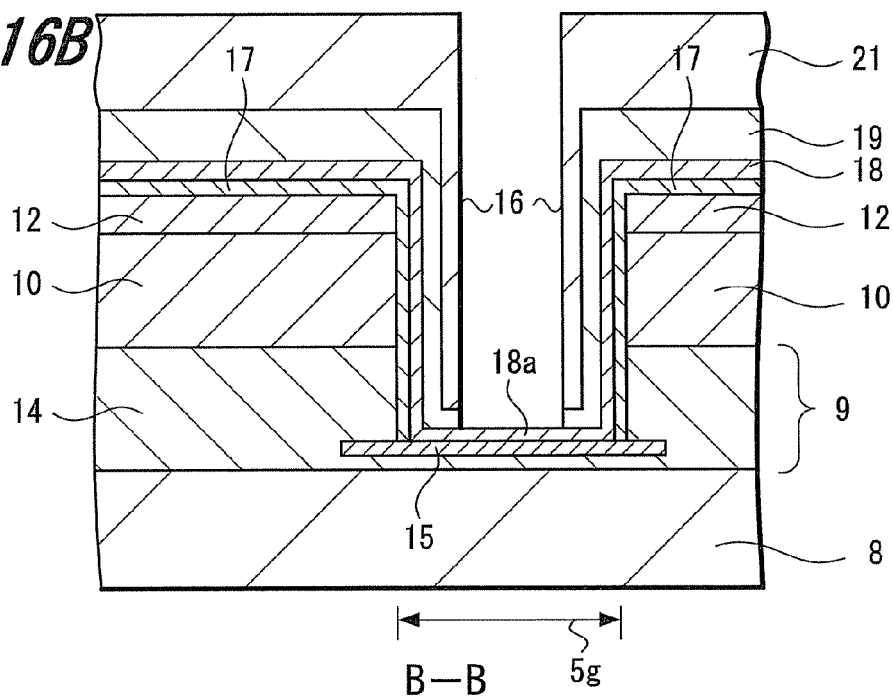

Finally, as shown in FIGS. 16A, 16B, the entire surface of the second resist layer 26 is etched. As illustrated in FIG. 16A, a shape of the on-chip microlens film 21 is transformed into the shape of the second resist layer 26 shown in FIG. 15A to form the on-chip microlenses 25 in the effective pixel region 3a and the optical black region 3b. Further, with the etching process, the first resist layer 20 placed in the openings 16 of the pad portion 5 and the ground connecting pad portion 5g is removed, thereby forming the openings 16 again. The first resist layer 20 placed in the openings 16 is etched so as to expose the interconnect M4 as shown in FIG. 16A whereas the first resist layer 20 is etched so as not to etch the shield film 18 as shown in FIG. 16B. The shield film 18 is exposed in the example shown in FIG. 16B; however, since the ground interconnect 15 has been in contact with the shield film 18, small amounts of the passivation film 19 or other films can be remained on the shield film 18. Further, as shown in FIG. 16B, since the passivation film 19, the on-chip maicrolens film 21, and the first resist layer 20 are formed in this order on the shield film 18 on the internal side-wall of the opening 16, moisture resistance of the shield film 18 on the internal side-wall can be improved, thereby preventing deterioration of the shield film 18.

In the pad portion 5 formed in this manner, the bonding wires 24 are wire-bonded with the interconnect M4 exposed from the bottom of the opening 16, thereby taking out the electrode to the outside. In this embodiment, Au fine wires may be employed as the bonding wires 24.

In this embodiment, since a layer including the silicon oxide film 17, the passivation film 19, and the on-chip microlens film 21 is formed on the internal side-wall of the opening 16, current will not be leaked from the bonding wires 24 via the Si semiconductor layer 10 due to the difference in the potential between the areas in the Si semiconductor layer 10. Moreover, since exposure of the interlayer dielectric 14 of the plurality of wiring layers 9 from the internal side-wall of the opening 16 can be prevented, absorption of moisture can be prevented in the interconnects included in the plurality of wiring layers 9 and the interlayer dielectric 14. Thus, the product reliability of the solid-state imaging device increases with an increase of the moisture resistance of the plurality of wiring layers 9.

Further, in this embodiment; since the shield film 18 is connected with the ground interconnect 15 in the ground connecting pad portion 5g, the potential of the shield film 18 is fixed to the same potential as the ground potential.

In this embodiment, a method of fabricating a solid-state imaging device includes forming the opening 16 including the pad portion 5 and the ground connecting pad portion 5g prior to depositing the insulating film and the silicon oxide film 17, both forming the antireflective film 45. Thus, the silicon oxide film 17 forming part of the antireflective film 45 can be uniformly formed on the internal side-wall of the opening 16. With this method, the shield film 18 and the bonding wires 24 will not be in contact with the Si semiconductor layer 10 in a case where the shield film 18 and the bonding wires 24 are formed on the internal side-wall of the opening 16. In a case of forming the shield film 18 on the antireflective film 45, if the ground connecting interconnect 15 has been provided to the opening 16, the step of connecting the shield film 18 to ground can simultaneously be carried out with the step of depositing the shield film 18. Since the shield film 18 on the internal side-wall of the opening 16 of the ground connecting pad portion 5g is covered with the passivation film 19 and on-chip microlens film 21, the moisture resistance of the shield film 18 can be improved, thereby preventing deterioration of the shield film 18.

The solid-state imaging device according to the embodiment, tungsten (W) is used as a material of the shield film 18; however, other materials such as aluminum (Al), molybdenum (Mo), ruthenium (Ru), and iridium (Ir) may also be used.

Figure 1:
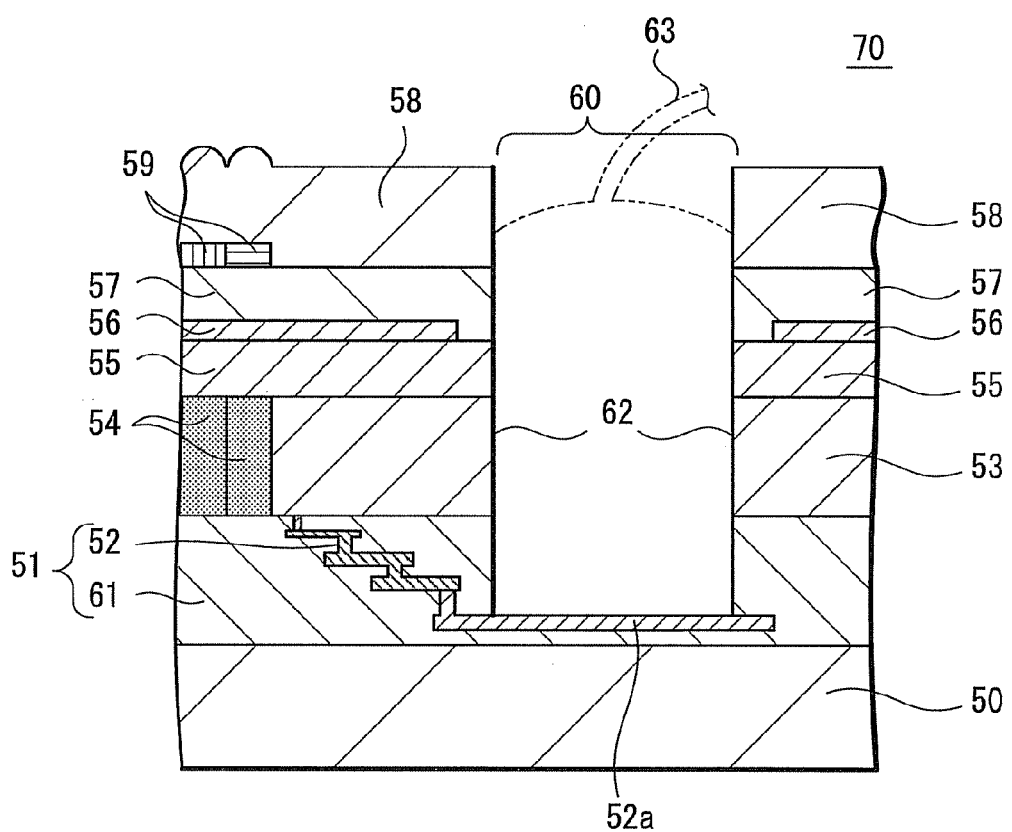
FIG. 1 is a schematic cross-section configuration diagram illustrating a solid-state imaging device according to the related art.
Figure 17A:
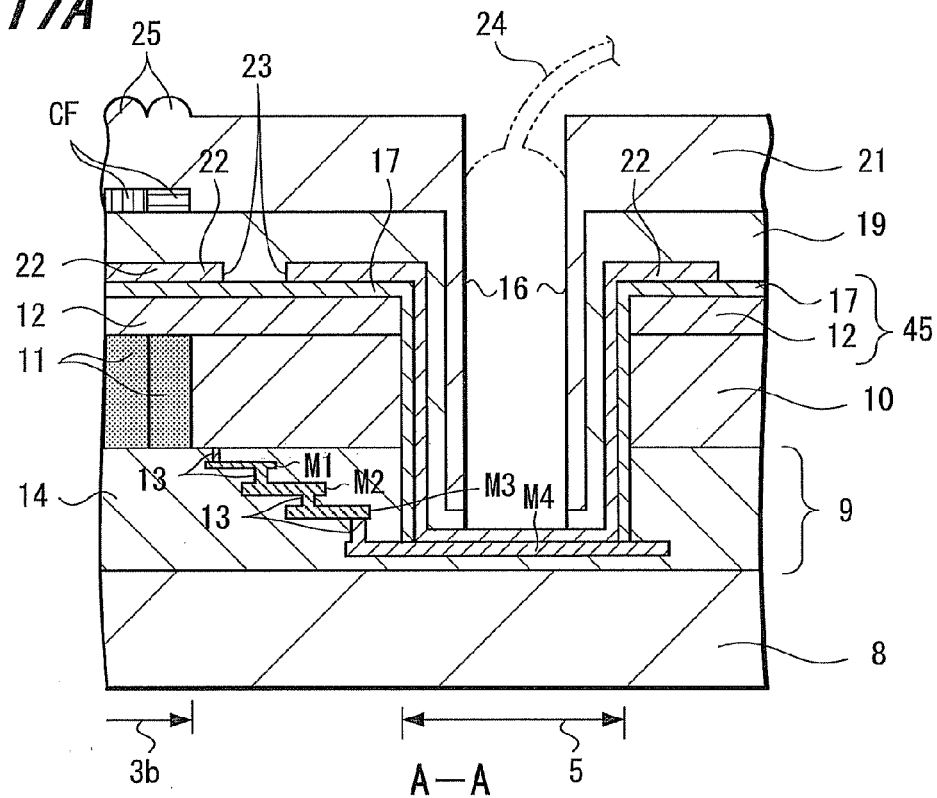
FIGS. 17A, 17B are respectively a cross-section configuration diagram along the line A-A, and a cross-sectional configuration diagram along the line B-B of a solid-state imaging device according to a second embodiment of the invention.
Figure 17B:
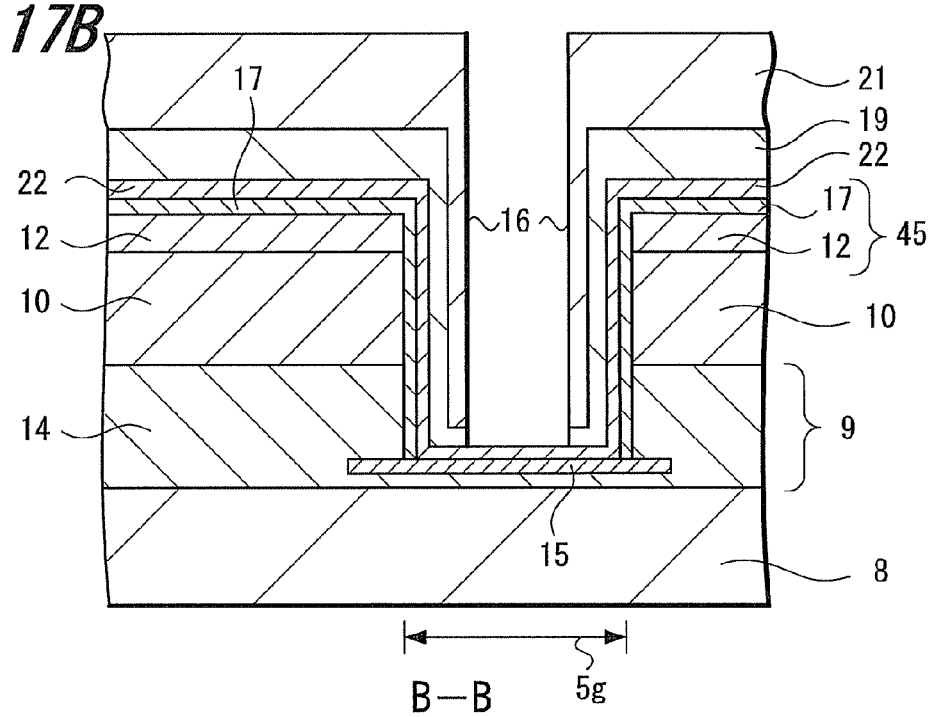

Next, FIG. 17 is a schematic diagram illustrating a solid-state imaging device according to a second embodiment of the invention. The solid-state imaging device according to this embodiment, aluminum is used as a material of the shield film, and the same reference numerals as those used in FIGS. 4, 5 are used to denote the corresponding parts in FIGS. 17A, 17B, and duplicated descriptions thereof are thus omitted. The solid-state imaging device according to the second embodiment includes the same configuration as that shown in FIG. 1. FIG. 17A shows the A-A cross-sectional configuration while FIG. 17B shows the B-B cross-sectional configuration in FIG. 2.

The solid-state imaging device according to the second embodiment is manufactured in compliance with the fabricating steps for the first embodiment; however, the location of depositing a shield film 22 in the second embodiment is different from that shown in the first embodiment.

In the second embodiment, an area of the shield film 22 corresponding to the effective pixel region 3a is etched in the similar manner as the first embodiment; however, an area of the shield film 22 corresponding to the opening 16 of the pad portion 5 is not etched. The shield film 22 is partially removed to form an insulating portion 23 such that the areas of the shield film 22 corresponding to the opening portion 16 of the pad portion 5 is electrically insulated from other areas of the shield film 22 including those corresponding to the opening portion of the ground connecting pad portion 5g. In this manner, the areas of the shield film 22 corresponding to the opening portion 16 of the pad portion 5 is electrically cut off from other areas of the shield film 22 formed on the ground connecting pad portion 5g by forming the insulating portion 23 in the shield film. Thus, according to this embodiment, by having the insulating portion 23, the area of the shield film 22 corresponding to the opening 16 of the pad portion 5 is electrically insulated from the area of the shield film 22 corresponding to the ground connecting pad portion 5g.

After the shield film 22 has selectively been formed in this manner, the passivation filrm 19, on-chip color filters CF, and on-chip microlenses 25 are formed in the similar steps as those conducted in the first embodiment. However, in an etching step for forming the on-ship microlenses 25, the bottom of the opening 16 of the pad portion 5 is etched so as to expose the shield film 16 as shown in FIG. 17A. The bottom of the opening 16 of the ground connecting pad portion 5g is etched so as not to etch the shield film 22. The shield film 22 is exposed in the example shown in FIGS. 17A, 17B; however, since the interconnect has been in contact with the shield film 22, small amounts of the passivation film 19 or other films can be remained on the shield film 22.

As similar to the first embodiment, since the shield film made of aluminum (Al) is brought into contact with the ground connecting interconnect 15 exposed from the opening 16 in the ground connecting pad portion 5g, the potential in the area of the shield film 22 corresponding to the ground connecting pad portion 5g is fixed to the same potential as the ground potential. The bonding wire 24 made of gold (Au) is connected to the external electrode and the interconnect M4 via the shield film 22 in the opening 16 of the pad portion 5. In this embodiment, the shield film 22 made of aluminum (Al) is alloyed with the boding wire 24 made of Au.

The internal side-wall of the opening 16 corresponding to the pad portion 5 in this embodiment is coated with the shield film 22 formed of metal layers via the insulating film formed of the silicon oxide film 17. Since one metal layer (shield film 22) is formed on the internal side-wall of the opening 16 of the pad portion 5 in this manner, it is possible to reduce damage to the insulating film (silicon oxide film 17) formed on the internal side-wall of the opening 16 of the pad portion 5 in wire bonding.

Further, the leak current can be prevented from flowing between the bonding wire 24 made of gold (Au) and the silicon layer 10 forming a semiconductor layer. Moreover, the interlayer dielectric 14 of the plurality of wiring layers 9 can be prevented from being exposed from the opening 16, and absorption of moisture in the metal interconnects used in the plurality of wiring layers 9 and in the interlayer dielectric 14 can also be prevented. Further, the passivation capability of the insulating film (silicon oxide film 17) can be increased by forming the metal layer (shield film 22) on the internal sidewall of the opening 16 of the pad portion 5.

As described in the second embodiment, if a material used for the shield film can be alloyed with a material for the bonding wire, the shield film can be left on the internal sidewall and the bottom of the opening of the pad portion. In the embodiments having the aforementioned configurations, it is possible to improve the reliability of the pad portion.

Figure 18:
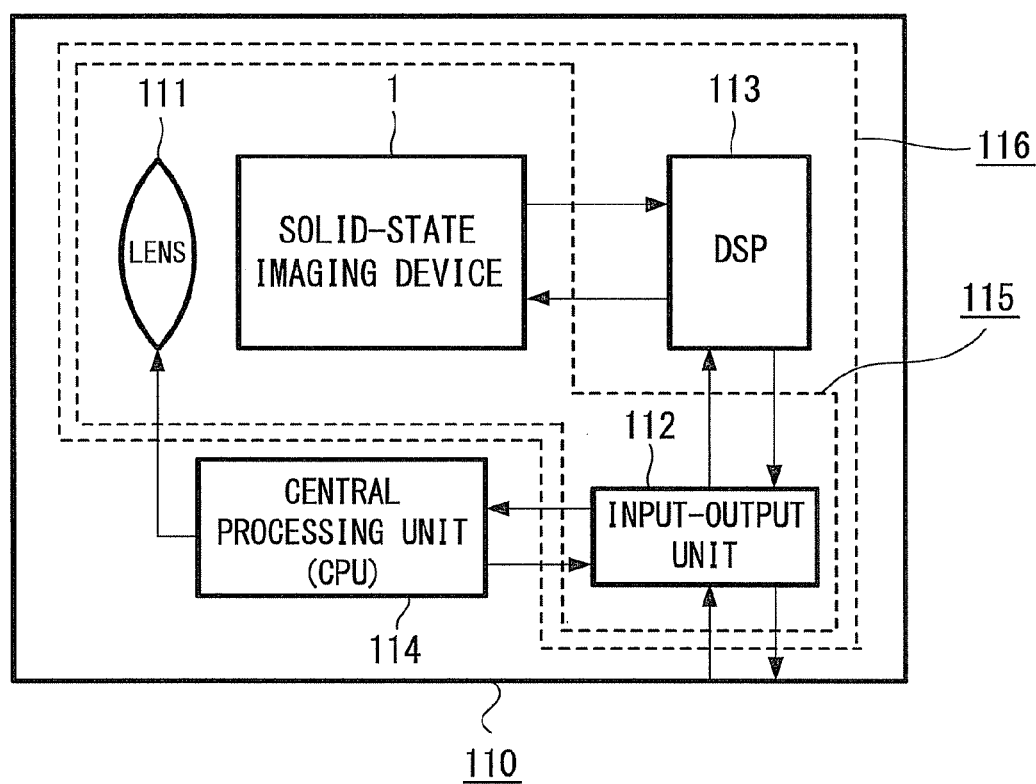
FIG. 18 is a schematic diagram illustrating a camera according to an embodiment of the invention.

A camera may be formed with the solid-state imaging device 1 of the aforementioned first or second embodiment. FIG. 18 shows a camera including the solid-state imaging device of the embodiment. The camera 110 shown in FIG. 18 is configured to include the backside-illuminated imaging device 1, an optical lens system 111, an input-output unit 112, a signal processor 113, and a central processing unit for controlling the optical lens system as one assembly. Alternatively, the backside-illuminated imaging device 1 can be configured to include the optical lens system 111, the input-output unit 112, and the signal processor 113. Further, as another example, a camera 115 is configured to only include the solid-state imaging device 1, the optical lens system 111, and the input-output unit 112. As still another example, a camera 116 is configured to include the solid-state imaging device 1, the optical lens system 111, the input-output unit 112, and the signal processor 113.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device that receives incident light through a backside thereof, the solid-state imaging device comprising:
   a semiconductor layer on which a plurality of pixels including photoelectric converters and pixel transistors are formed;
   a wiring layer on a first surface of the semiconductor layer;
   a pad portion on a second surface of the semiconductor layer;
   an on-chip microlens layer carried on the second surface of the semiconductor layer;
   an opening in the semiconductor layer exposing a conductive layer of the wiring layer;
   an insulating film extending from the second surface to an internal side-wall of the opening so as to insulate the semiconductor layer; and
   a light shield film on the insulating film,
   wherein,
   a portion of the on-chip microlens layer lines said internal side-wall of said opening in the vertical direction, and
   a portion of the light shield film is removed so that a portion of the light shield film coating said internal side-wall of said opening is insulated from a remainder of said light shield film.

2. A solid-state imaging device according to claim 1, further comprising a bonding wire connected to the conductive layer exposed at a bottom of the opening.

3. A solid-state imaging device according to claim 1, wherein the insulating film includes an antireflective film.

4. A solid-state imaging device according to claim 1, wherein the insulating film includes an antireflective film, a passivation film, and an on-chip microlens film.

5. A method of fabricating a solid-state imaging device comprising:
   forming a wiring layer on a first surface of a semiconductor layer having a plurality of pixels including photoelectric converters and pixel transistors;
   forming in the semiconductor layer an opening corresponding to a pad portion of a second surface of the semiconductor layer so as to reach a conductive layer of the wiring layer;
   forming an insulating film extending from the second surface to an internal side-wall of the opening so as to insulate the semiconductor layer;
   forming a light shield film on said insulating film with a portion thereof removed so that a portion of the light shield film coating said internal side-wall is insulated from a remaining portion of said light shield film; and
   forming an on-chip microlens layer on said second surface of said semiconductor layer such that a portion of said on-chip microlens layer lines said internal side-wall of said opening in the vertical direction.

6. A method of fabricating a solid-state imaging device according to claim 5, further comprising:
   connecting a bonding wire to the conductive layer exposed at a bottom of the opening.

7. A method of fabricating a solid-state imaging device according to claim 5, wherein in the step of forming the insulating film, using an antireflective film as the insulating film.

8. A camera comprising:
   a solid-state imaging device;
   an optical lens; and
   a signal processor,
   wherein,
   the solid-state imaging device includes (a) a semiconductor layer on which a plurality of pixels including photoelectric converters and pixel transistors are formed; (b) a wiring layer on a first surface of the semiconductor layer; (c) a pad portion on a second surface of the semiconductor layer; (d) an on-chip microlens layer on said second surface of the semiconductor layer; (e) an opening in the semiconductor layer that reaches a conductive layer of the wiring layer; (f) an insulating film extendedly formed from the second surface to an internal side-wall of the opening so as to coat the semiconductor layer; and (g) a light shield film formed on the insulating film,
   wherein,
   a portion of said on-chip microlens layer lines said internal side-wall of said opening in the vertical direction, and
   a portion of the light shield film is removed so that a portion of the light shield film coating said internal side-wall of said opening is insulated from a remainder of said light shield film.

* * * * *